(12) United States Patent
Mirichigni et al.

(10) Patent No.: US 11,682,439 B2
(45) Date of Patent: Jun. 20, 2023

(54) PARALLEL ACCESS FOR MEMORY SUBARRAYS

(71) Applicant: Micron Technology, Inc., Boise, ID (US)

(72) Inventors: Graziano Mirichigni, Vimercate (IT); Efrem Bolandrina, Fiorano al Serio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/381,976

(22) Filed: Jul. 21, 2021

(65) Prior Publication Data
US 2022/0013157 A1 Jan. 13, 2022

Related U.S. Application Data

(62) Division of application No. 16/515,629, filed on Jul. 18, 2019, now Pat. No. 11,074,949.

(51) Int. Cl.
*G11C 7/22* (2006.01)
*G11C 8/08* (2006.01)
(Continued)

(52) U.S. Cl.
CPC .............. *G11C 8/08* (2013.01); *G06F 3/0683* (2013.01); *G11C 7/106* (2013.01); *G11C 7/109* (2013.01);
(Continued)

(58) Field of Classification Search
None
See application file for complete search history.

(56) References Cited

U.S. PATENT DOCUMENTS 6,462,998 B1 10/2002 Proebsting
9,236,112 B1 * 1/2016 Raad ................... G11C 11/4094
(Continued)

FOREIGN PATENT DOCUMENTS

KR 20180065095 A 6/2018

OTHER PUBLICATIONS

ISA/KR, International Search Report and Written Opinion of the International Searching Authority, Int'l Appl. No. PCT/US2020/037221, Sep. 21, 2020, Korean Intellectual Property Office, Seo-gu, Daejeon, Republic of Korea, 12pgs.
Taiwan Intellectual Property Office, "Office Action," issued in connection with ROC (Taiwan) Patent Application No. 109120077, dated Mar. 3, 2021 (5 pages).
(Continued)

*Primary Examiner* — Alfredo Bermudez Lozada
(74) *Attorney, Agent, or Firm* — Holland & Hart LLP

(57) ABSTRACT

Techniques herein may allow a row of a subarray in a bank of a memory device to be activated before a precharge operation has been completed for a previously opened row of memory cells in the same bank. Each subarray within the bank may be associated with a respective local latching circuit, which may be used to maintain phases at the subarray independent of subsequent commands to the same bank. For example, the latching circuit may internalize timing signals triggered by a precharge command for a first row such that if an activation command is received for a different subarray in the same bank at a time before the precharge operation of the first row is complete, the precharge operation may continue until the first row is closed, as the timing signals triggered by the precharge command may be maintained locally at the subarray using the latching circuit.

19 Claims, 13 Drawing Sheets

(51) Int. Cl.
    *G06F 3/06*          (2006.01)
    *G11C 11/22*        (2006.01)
    *G11C 11/408*      (2006.01)
    *G11C 7/10*         (2006.01)
    *G11C 11/4096*     (2006.01)

(52) U.S. Cl.
    CPC .......... *G11C 7/1063* (2013.01); *G11C 7/1087* (2013.01); *G11C 7/22* (2013.01); *G11C 11/2257* (2013.01); *G11C 11/2259* (2013.01); *G11C 11/2273* (2013.01); *G11C 11/2275* (2013.01); *G11C 11/4085* (2013.01); *G11C 11/4096* (2013.01)

(56) References Cited

U.S. PATENT DOCUMENTS

| | | |
|---|---|---|
| 2011/0141836 A1 | 6/2011 | Luthra et al. |
| 2014/0208156 A1 | 7/2014 | Muralimanohar et al. |
| 2015/0309743 A1 | 10/2015 | Sohn et al. |
| 2019/0103156 A1 | 4/2019 | Sumbul et al. |
| 2019/0189189 A1* | 6/2019 | Hush .................. G11C 11/4091 |

OTHER PUBLICATIONS

Taiwanese Patent Office, "Office Action and Search Report", issued in connection with Taiwanese Patent Application No. 110136974 dated May 20, 2022 (8 pages).

* cited by examiner

PARALLEL ACCESS FOR MEMORY SUBARRAYS

CROSS REFERENCE

The present application for patent is a divisional of U.S. patent application Ser. No. 16/515,629 by Mirichigni et al., entitled "PARALLEL ACCESS FOR MEMORY SUBARRAYS," filed Jul. 18, 2019, assigned to the assignee hereof, and is expressly incorporated by reference in its entirety herein.

BACKGROUND

The following relates generally to a system that includes at least one memory device and more specifically to parallel access for memory subarrays.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

A memory device may be organized into banks, which then may be organized into subarrays each containing rows of memory cells. Access operations may be used to access data stored on the memory cells which may involve an activation command to open a row of memory cells within a subarray of the bank, an access command (e.g., a read command or a write command) to access (e.g., read or write) data in the opened row, and a precharge command to close the opened row.

DETAILED DESCRIPTION

Figure 1:
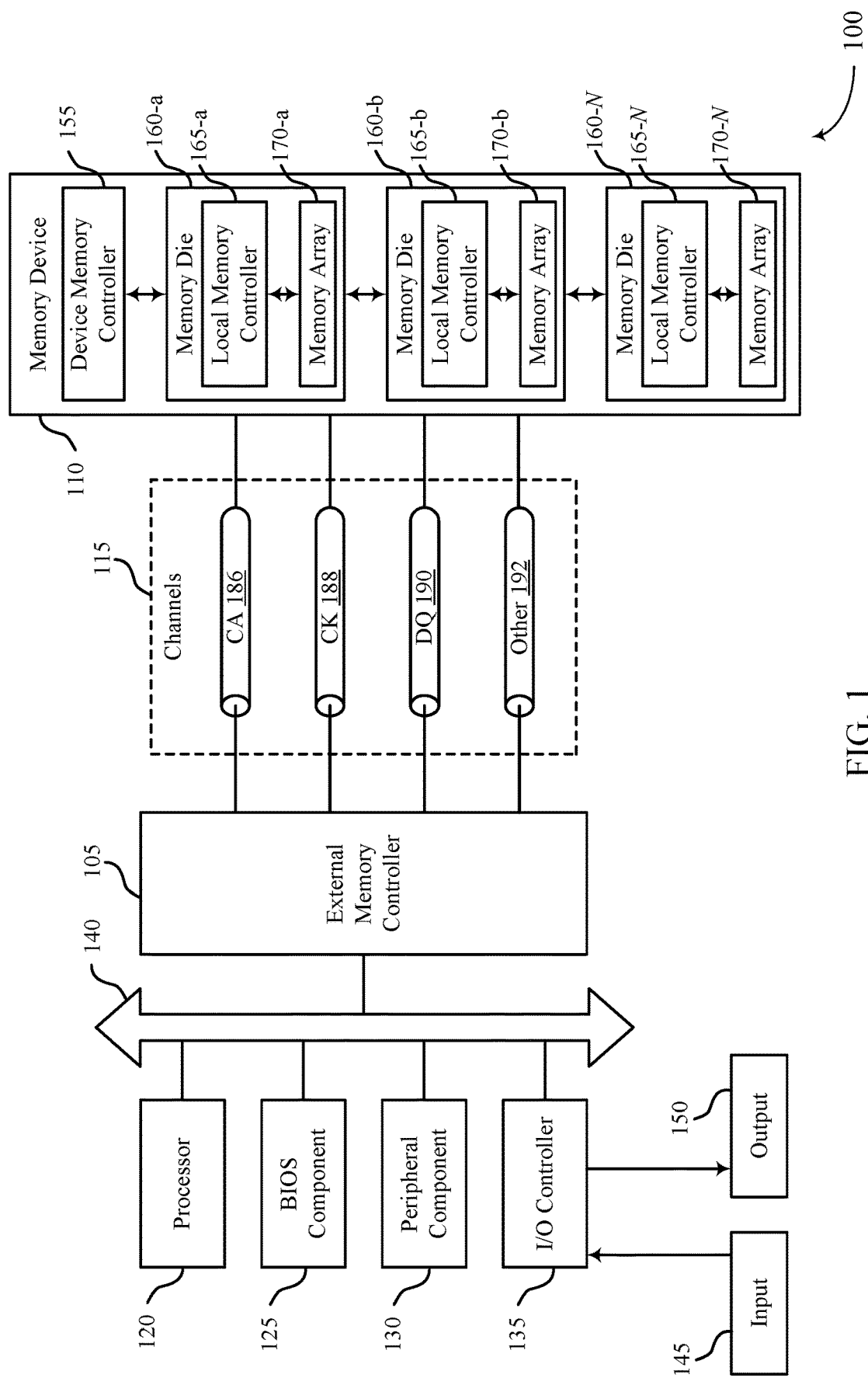
FIG. 1 illustrates an example of a system that supports parallel access for memory subarrays in accordance with examples as disclosed herein.

To access a memory cell within a row of a subarray within a bank of a memory device (e.g., a random access memory (RAM) device), separate operations may be performed which may be triggered by separate, corresponding commands (e.g., sent by a host device or a controller of the host device) to the memory device. For example, the memory device may receive an activation command for a row of memory cells, which may trigger an activation operation. The activation operation may open a row of memory cells within a given subarray of a given bank. After the activation command, the memory device may receive an access command (e.g., a read, a write, a program, a rewrite, etc.) directed to the opened row. Based on the access command, the memory device may read data from or write data to one or more memory cells of the opened row. The memory device may then receive a precharge command directed at the opened row. Based on the precharge command, the memory device may close the opened row, which may lead to completion of the access operation.

Subarrays within a bank of a memory device may utilize local row buffers to access the data stored in the respective subarray of memory (e.g., each subarray in the bank may have a corresponding local row buffer). Some memory devices, however, may support only a single set of active phases per bank, where phases may refer to timing signals or other control signals that control internal operations (e.g., internal to the bank) associated with executing commands such as activation, access, and precharge commands. In some cases, if phases are maintained on a per-bank basis, accessing a subsequent row in a bank may not occur until after a precharge operation for a previously accessed row in the same bank has completed, regardless of whether the previously accessed row and the subsequent row are in same subarray or in different subarrays within the bank. For example, phases associated with opening the subsequent row may and phases associated with closing the previously accessed row may not be able to be concurrently maintained (e.g., newly generated phases may overwrite or otherwise destroy the prior-generated phases for the bank). The delay between completion of the precharge operation (e.g., closing one or more rows of memory cells) and an activation command for a subsequent row of memory cells may cause latency, which may increase the amount of time for accessing memory cells within a memory device.

According to aspects herein, a row of a subarray in a bank may be accessed before a precharge operation has been completed for a previously opened row of memory cells in the same bank, if the two rows are in different subarrays within the bank. This may allow for parallel accesses of different subarrays within a same bank (e.g., the access of one subarray in a bank may at least partially overlap in time with the access of another subarray in the bank), which may provide reduced latency, among other performance benefits as may be appreciated by one of ordinary skill in the art.

For example, along with each subarray within the bank having its own row buffer, each subarray within the bank may also be associated with (e.g., may include or be coupled with) a respective local latching circuit, which may maintain (preserve, store) the phases associated with commands for the subarray (e.g., phases for activation commands, access commands, or precharge commands) independent of any phases associated with commands for other subarrays, even other subarrays within the same bank. In some cases, the latching may be viewed as a duplication of the phases for the subarray, which may be generated outside the subarray or bank (e.g., by a memory controller or other component not specific to the subarray)—the latching circuit may then maintain duplicate versions of the externally-generated phases, and the local duplicates may be used to execute the associated commands, even if new commands are received by the memory device for other subarrays (which may destroy the phases other than as maintained by the latching circuit—e.g., may destroy the original phases as generated outside the subarray or bank).

For instance, if an activation signal is received for the same bank (e.g., for a different subarray) before the precharge operation of a first row is complete (e.g., using a shorted row precharge time (tRP_S), the precharge operation may nevertheless continue until the first row is closed, as the precharge phases may be maintained locally at the subarray using the latching circuit. In some cases, however, because each subarray may be associated with one corresponding latching circuit, phases associated with two rows in the same subarray may not be concurrently maintained by the latching circuitry. In such instances, an activation signal for a second row in the same subarray may be received after completion of a precharge operation of a first row in the same subarray (e.g., using a default row precharge time (tRP), which may be longer than tRP_S). In some cases, a tRP (whether the default tRP or tRP_S) may represent a number of clock cycles, which may be the minimum number of clock cycles, that occur (e.g., are observed by the host device) between issuing of a precharge command for a previously opened row and an activate command for a subsequently (e.g., immediately consecutively) opened row.

Features of the disclosure are initially described in the context of a memory system and memory die as described with reference to FIGS. 1 and 2. Features of the disclosure are described in the context of command timelines as described with reference to FIGS. 3-7. These and other features of the disclosure are further illustrated by and described with reference to an apparatus diagram and flowcharts that relate to parallel access for memory subarrays as described with references to FIGS. 8-13.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some examples, the host device may transmit multiple activation commands to the memory device 110 (e.g., via the external memory controller 105). For instance, the host device may determine to access one or more rows of memory cells within the memory device 110 (e.g., within the same or different subarrays of the memory device 110, within the same or different banks of the memory device 110) and may transmit an activation command to access a first row of memory cells and a second activation command to access a second row of memory cells. The first and second rows may be in a same bank, and the host device may determine a time to transmit the second activation command based on whether the first and second rows of memory cells are also in the same subarray or are in different subarrays of the bank. According to some aspects, the host device may select between a default tRP or a tRP_S when determining a time for transmission of the second activation command. The selected default tRP or tRP_S may indicate (specify) a delay between transmission of a precharge command from the host device to close the first row of memory cells, which may occur after transmission of the first activation command. The host device may transmit the second activation command following transmission of the precharge command to the first row, with a delay (time duration between the two commands) that corresponds to the selected default tRP or tRP_S.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as a multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

In some examples, a memory array 170 may include multiple memory banks, and each memory bank may include multiple subarrays. In some cases, each subarray includes multiple rows of memory cells, which may be accessible by an external device (e.g., a host device, external memory controller 105). A given subarray may include or utilize a corresponding latching circuit, which may allow the memory device 110 to maintain phases (e.g., timing signals associated with an access operation such as a precharge command) for a row of memory cells of the given subarray independent of phases for rows of memory cells in other subarrays, even other subarrays in the same bank.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., access commands, including read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

The external memory controller 105 may be part of or associated with a host device and may send one or more commands to the memory device 110. In some examples, the external memory controller may send an activation command to the memory device 110 to open a row of memory cells in a subarray followed by an access command to access the row of memory cells in the subarray. The external memory controller 105 may determine to access a second row of memory cells (e.g., in a same or different subarray) and may select a time for sending a second activation command to the memory device 110 based on a tRP or a tRP_S, each of which may correspond to a delay (e.g., a time duration to wait) between a precharge command for the first row and the second activation command. For instance, the external memory controller 105 may determine to send the second activation command to open a second row of memory cells following a precharge command for a first row of memory cells according to the tRP_S if the second row of memory cells is in a different subarray than the first row of memory cells. In other cases, the external memory controller 105 may determine to send the second activation command to open a second row of memory cells following a precharge command for a first row of memory cells according to the tRP if the second row of memory cells is in the same subarray.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
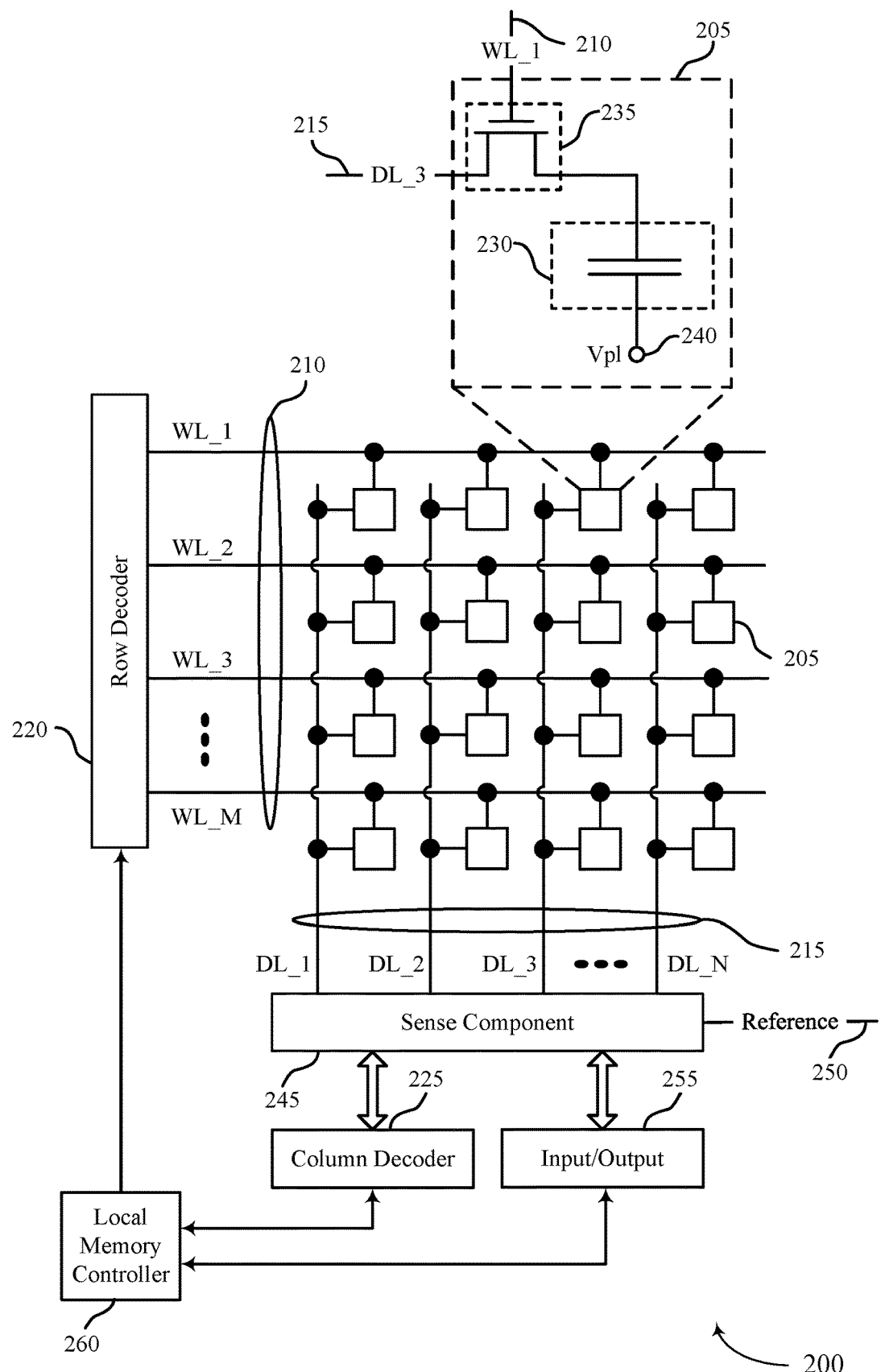
FIG. 2 illustrates an example of a memory die that supports parallel access for memory subarrays in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed (e.g., ferroelectric materials).

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

In some examples, a portion of memory cells 205 may be part of a row of memory cells 205 of a subarray of a memory bank. The row of memory cells 205 may be accessed (e.g., by a host device) through one or more commands. For example, the row of memory cells 205 may be opened based on an activation command, an access command (e.g., a read command or a write command) may access data stored on or write data to the row of memory cells 205, and the row of memory cells 205 may be closed based on a precharge command. Access to a second row of memory cells 205 within the same subarray may be performed through an activation command after a first delay (e.g., corresponding to tRP) following a precharge command. Access to a second row of memory cells 205 within a different subarray may be performed through an activation command after a second, shorter delay (e.g., corresponding to tRP_S) following a precharge command.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of the memory cell 205 may be provided as an output of the sense component 245 (e.g., to an input/output 255), and may indicate the detected logic state to another component of a memory device 110 that includes the memory die 200, such as a device memory controller 155 (e.g., directly or using the local memory controller 260).

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
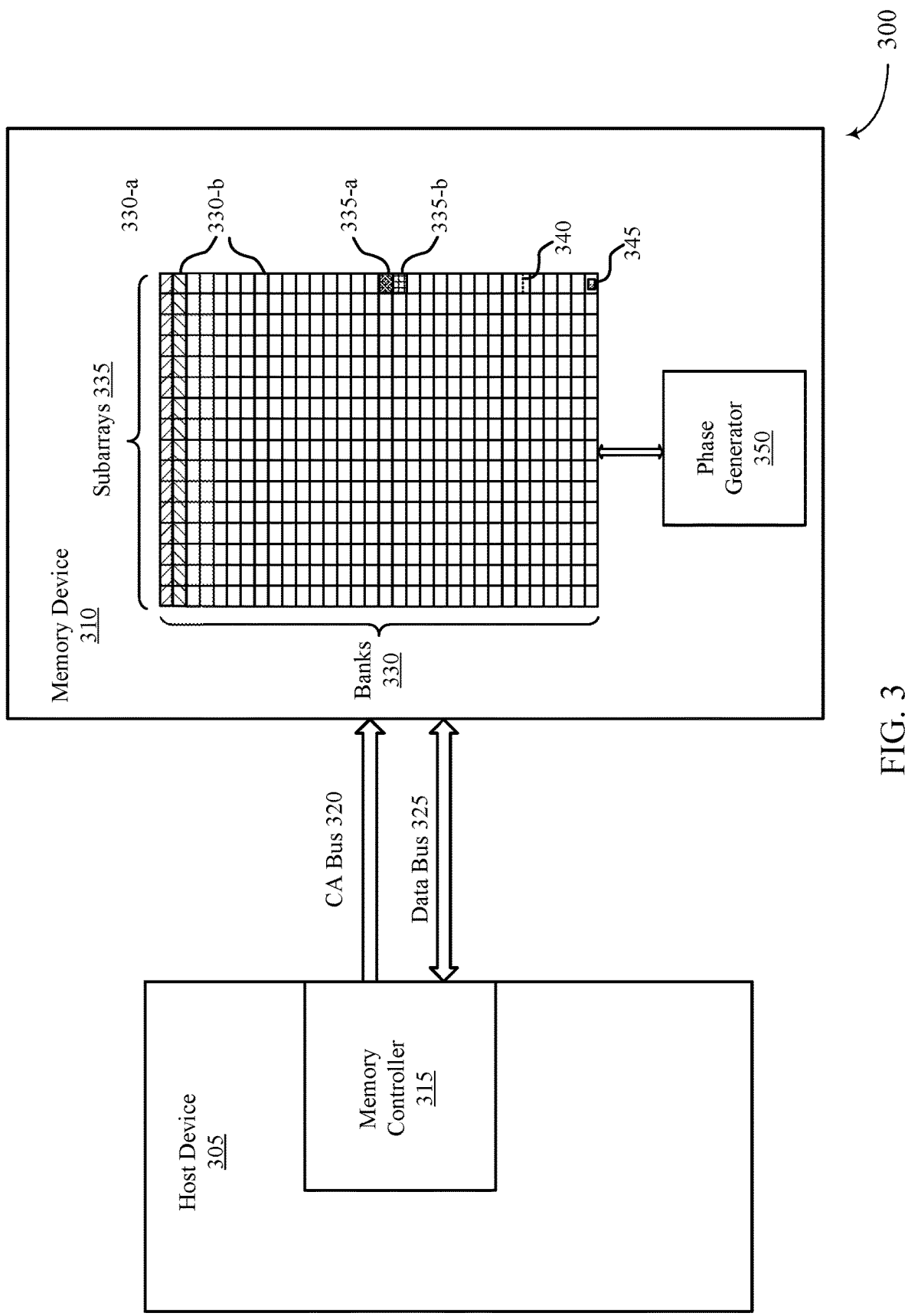
FIG. 3 illustrates an example of a memory storage system that supports parallel access for memory subarrays in accordance with examples as disclosed herein.

FIG. 3 illustrates an example of a memory storage system 300 that supports parallel access for memory subarrays in accordance with examples as disclosed herein. Memory storage system 300 may include host device 305 and memory device 310. Host device 305 may include memory controller 315 (which may be an example of an external memory controller as described with reference to FIG. 1), which may communicate with memory device 310 (which may be an example of a memory device 110 as described with reference to FIG. 1) through CA bus 320 and/or data bus 325. Memory device 310 may utilize DRAM, FeRAM, or other types of memory to store data at the memory device 310. The data stored in memory device 310 may be accessible by memory controller 315 and the process of accessing data stored at memory device 310 by memory controller 315 may be referred to as an access operation.

An access operation, such as a read or a write operation may be communicated (e.g., sent by the host device 305) to memory device 310 as a series of commands (e.g., as a command sequence). The commands may be communicated to memory device 310 by memory controller 315 over CA bus 320 (which be an example of a CA bus 186). The commands may be received by memory device 310, and may trigger corresponding operations at memory device 310 to read, write, or otherwise access data stored by the memory device 310 (e.g., at one or more memory cells of the memory device 310). The data stored at or written to the memory device 310 may be communicated between the host device 305 and the memory device 310 over data bus 325 (which be an example of a DQ bus 190).

Memory device 310 may include multiple subarrays 335. The subarrays 335 may store data contained in memory device 310. Subarrays 335 may be grouped into banks 330. In some examples, memory device 310 may contain thirty-two banks 330, each of which may include multiple subarrays 335 of memory cells. For instance, one or more banks 330 may contain sixteen subarrays 335. First subarray 335-a and second subarray 335-b may be examples of subarrays 335 and, as shown in this example, are located in two different banks 330 of memory device 310. The subarrays 335 may each contain individual rows memory cells, such as row 340, that may store data associated with memory device 310 or may have data written thereto.

In some cases, a command received by the memory device 310 may cause the memory device 310 to generate one or more related phases (e.g., using phase generator 350). For example, for each activate, access, or precharge command received by the memory device 310, the phase generator 350 of the memory device 310 may generate a related set of phases. The related set of phases may refer to or may include timing signals that collectively trigger or otherwise control sequences of internal operations within a subarray 335—executing a commanded operation may include executing a collection of such internal operations (e.g., executing an activation operation at a subarray 335 may include executing a first collection of phase-controlled internal operations, executing an access operation such as a read or write operation at a subarray 335 may include executing a second collection of phase-controlled internal operations, and executing a precharge operation at a subarray 335 may include executing a third collection of phase-controlled internal operations). Thus, the phases may govern the internal timing of the access operations of a given row of a given subarray 335 to which the commands are directed. In some examples, the phases may be internal timing signals that trigger the electrical operations (e.g., the physical electrical operations) corresponding to the commanded operations on an individual row basis to access memory cells of a given row 340.

The memory device 310 may include any number of phase generators 350 (e.g., one per subarray 335, one per bank 330, one per memory die, or one per memory device 310). As one example, a phase generator 350 may be included in or include aspects of a device memory controller 155 or a local memory controller 165 included in the memory device 310. As another example, a phase generator 350 may include logic or other special-purpose circuitry, which may be included in, coupled with, or otherwise associated with the bank 330 targeted by the corresponding command (e.g., each bank 330 may include, be coupled with, or be otherwise associated with a respective phase generator 350)—that is, phases may be generated on a per-bank 330 basis. Phases and other signals generated within the memory device 310 but outside of a corresponding subarray 335 may be referred to as global phases or signals. As another example, each subarray 335 may include, be coupled with, or be otherwise associated with a respective phases generator 350, and phases may be generated locally for each subarray 335.

Global phases may be generated per bank 330. This may support different banks 330 being accessed concurrently (in parallel, with accesses to rows in different banks 330 at least partially overlapping in time). In some examples, an activation and/or precharge operation on a row 340 in a bank 330 may occur while an activation and/or precharge operation occurs on a row 340 in a different bank 330 in memory device 310.

In some examples, each subarray 335 may include, use, or otherwise be associated with a corresponding (e.g., one corresponding) row buffer for accessing the data stored in the subarray 335. Additionally or alternatively, each subarray 335 within a bank 330 may include, use, or otherwise be associated with a corresponding latching circuit 345, which may duplicate phases associated with the subarray 335 and maintain (preserve, store) the phases independent of phases associated with the remaining subarrays 335 in the bank 330 or the memory device 310. For example, a latching circuit 345 may store duplicate versions (copies) of global phases or other signals associated with (for executing operations on) the corresponding subarray 335. The latching circuits 345 may enable optimization of memory storage system 300 in accordance with examples described herein. For example, this may support different subarrays 335 of a same bank 330 being accessed concurrently (in parallel, with accesses to rows in different subarrays 335 of a same bank 330 at least partially overlapping in time). In some examples, an activation and/or precharge operation on a row 340 in a first subarray 335 of a bank 330 may occur while an activation and/or precharge operation occurs on a row 340 in a second subarray of the bank 330 in memory device 310.

Accessing a row 340 may involve one or more operations, and each operation may contribute to the overall latency of accessing the row. Such operations may be based on (in response to) corresponding commands, which may be communicated by memory controller 315 to the memory device 310. The commands to access a row 340 within a subarray 335 in a bank 330 may include an activation command (corresponding to an activation operation), a access command (corresponding to, e.g., a read operation, a write operation, a program operation, a reset operation, a rewrite operation), and a precharge command (corresponding to a precharge operation). The activation operation may open the row 340 of memory cells. The access operation may access the data contained in the opened (e.g., activated) row 340 (e.g., in case of a read operation) or write data into the opened row 340 (e.g., in case of a write operation). The precharge operation may close the opened row 340.

All three operations may be executed to access a row 340 of memory cells within a subarray 335 in a bank 330 of memory device 310. In some examples, the activation operation may be performed before a access operation to open the row 340. Additionally, the precharge operation may be performed after a access operation to close the activated row 340. In some cases, a precharge operation may be performed before a subsequent access operation of a row 340 in the same bank 330. The corresponding commands may be communicated from memory controller 315 to memory device 310 as a series of commands (e.g., as a command sequence). The commands may include an activation command, a access command, and a precharge command, and may be received in the order the corresponding operations are performed.

Figure 4:
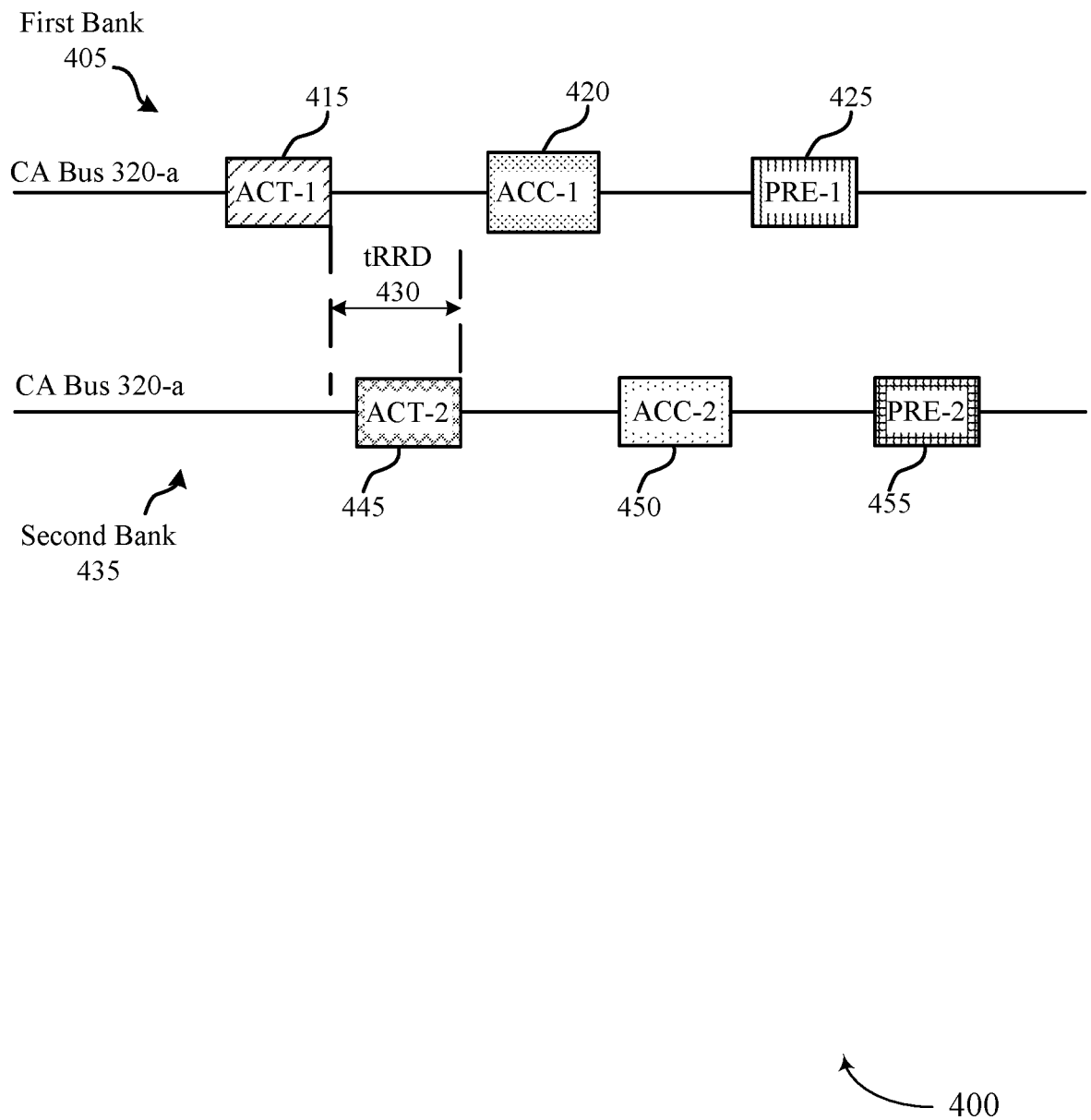
FIGS. 4 through 7 illustrate examples of command timelines that support parallel access for memory subarrays in accordance with examples as disclosed herein.

FIG. 4 illustrates an example of a command timeline 400 that supports parallel access for memory subarrays in accordance with examples as disclosed herein. FIG. 4 illustrates example accesses of two rows in two different subarrays within different banks of a memory device, which may be examples of the corresponding devices as described with respect to FIG. 3. For instance, first bank 405 and second bank 435 may be two individual banks within a memory device.

A memory device that includes first bank 405 and second bank 435 may receive commands from a host device, such as memory controller 315 of FIG. 3. The host device may communicate the commands to the memory device over a CA bus 320-a. Commands associated with the first bank 405 and the second bank 435 may be received over the same CA bus 320-a, but two instances of the CA bus 320-a may appear in FIG. 4 for clarity in illustrating the separate commands associated with the two banks 405, 435.

The memory device may receive, over the CA bus 320-a, first activation command 415 for a row of memory cells (e.g., in a subarray) in the first bank 405. First activation command 415 may trigger activation phases, which may comprise timing or other signals for internal operations used to open the row in first bank 405.

The memory device may subsequently receive, over the CA bus 320-a, first access command 420 for one or more memory cells within the row in the first bank 405. First access command 420 may trigger additional phases (not shown), which may comprise timing or other signals for internal operations used to read, write, or otherwise access memory cells within the open row in the first bank 405.

The memory device may subsequently receive, over the CA bus 320-a, a first precharge command 425 for the row in the first bank 405. First precharge command 425 may trigger precharge phases (not shown), which may comprise timing or other signals for internal operations used to close the row in the first bank 405.

The memory device may also receive, over the CA bus 320-a, a second activation command 445 for a row of memory cells (e.g., in a subarray) in the second bank 435. Second activation command 445 may trigger activation phases (not shown), which may comprise timing or other signals for internal operations used to open the row in the second bank 435.

The memory device may subsequently receive, over the CA bus 320-a, second access command 450 for one or more memory cells within the row in the second bank 435. Second access command 450 may trigger additional phases (not shown), which may comprise timing or other signals for internal operations used to read, write, or otherwise access memory cells within the open row in the second bank 435.

The memory device may subsequently receive, over the CA bus 320-a, a second precharge command 455 for the row in the second bank 435. Second precharge command 455 may trigger precharge phases (not shown), which may comprise timing or other signals for internal operations used to close the row in the second bank 435.

In some examples as described herein, however, the memory device that includes the first bank 405 and the second bank 435 may maintain phases using subarray-specific structures or processes that operate at the subarray level of granularity (e.g., subarray-specific latching circuits 345, as described in reference to FIG. 3). For example, the memory device may maintain phases using structures or processes that are specific to (e.g., dedicated to, included in) first bank 405.

Time tRRD 430 (e.g., row to row access time delay) may be the time elapsed (e.g., a number of clock cycles, which may be the minimum number of clock cycles) between the memory device receiving first activation command 415 for a row of a subarray in first bank 405 and the memory device receiving second access command 445 for a row of a subarray in second bank 435.

In some cases, tRRD 430 may be less than the time for the internal operations governed by phases triggered by the first activation command 415 to access the open row inside first bank 405. Activating a row in second bank 435 before the subsequent access and/or precharge operations of a row in first bank 405 may be possible due to first bank 405 and second bank 435 having respective row buffers for accessing the data stored in the rows contained in the separate banks. In some examples, for a memory device described herein, subarrays within the first bank 405 and the second bank 435 may have respective latching circuits (e.g., latching circuits 345 of FIG. 3) configured to maintain phases internal to the memory device triggered by the commands sent over CA bus 320-a. The latching circuits may allow a host device to access rows of memory cells within one bank (e.g., one of first bank 405 or second bank 435) according to different time delays (e.g., a tRP or a tRP_S) based on whether the rows are in a same or different subarray within the same bank (e.g., one of first bank 405 or second bank 435).

Figure 5:
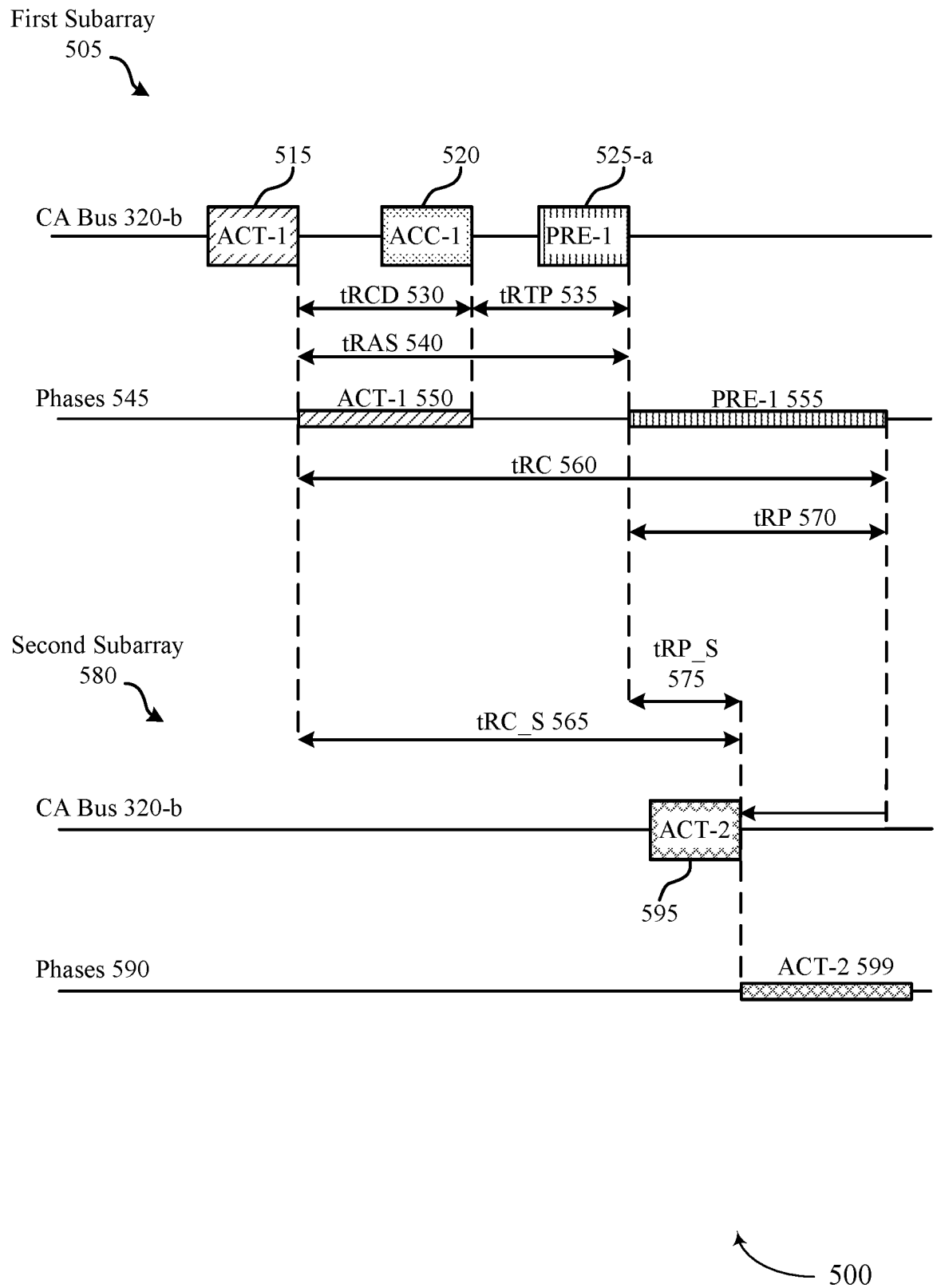

FIG. 5 illustrates an example of a command timeline 500 that supports parallel access for memory subarrays in accordance with examples as disclosed herein. FIG. 5 illustrates example accesses of two rows in two different subarrays within the same bank of a memory device, which may be examples of the corresponding devices as described with respect to FIGS. 3 and 4. For instance, first subarray 505 and second subarray 580 may be two individual subarrays within the same bank of a memory device.

A memory device that includes first subarray 505 and second subarray 580 may receive commands from a host device, such as memory controller 315 of FIG. 3. The host device may communicate the commands to the memory device over a CA bus 320-b. Commands associated with the first subarray 505 and the second subarray 580 may be received over the same CA bus 320-b, but two instances of the CA bus 320-b may appear in FIG. 5 for clarity in illustrating the separate commands associated with the two subarrays 505, 580. Commands associated with the first subarray 505 may trigger phases 545, and commands associated with the second subarray 580 may trigger phases 590.

The memory device may receive, over the CA bus 320-b, first activation command 515 for a row of memory cells in the first subarray 505. First activation command 515 may trigger first activation phases 550, which may comprise timing or other signals for internal operations used to open the row in first subarray 505.

The memory device may subsequently receive, over the CA bus 320-b, first access command 520 for one or more memory cells within the row in the first subarray 505. First access command 520 may trigger additional phases (not shown), which may comprise timing or other signals for internal operations used to read, write, or otherwise access memory cells within the open row in the first subarray 505.

The memory device may subsequently receive, over the CA bus 320-b, a first precharge command 525-a for the row in the first subarray 505. First precharge command 525-a may trigger precharge phases 555, which may comprise timing or other signals for internal operations used to close the row in the first subarray 505.

The memory device may also receive, over the CA bus 320-b, a second activation command 595 for a row of memory cells in the second subarray 580. Second activation command 595 may trigger second activation phases 599, which may comprise timing or other signals for internal operations used to open the row in the second subarray 580.

The memory device may subsequently receive, over the CA bus 320-b, additional commands (not shown) (e.g., a access command to access the open row in the second subarray 580, a precharge command to close the row in the second subarray 580).

The latency of accessing rows on a memory device may be based on various global operation timings, examples of which are illustrated in FIG. 5. For example, time tRCD 530 (e.g., row address to column address delay) may be the time elapsed (e.g., a number of clock cycles, which may be the minimum number of clock cycles) between the memory device receiving first activation command 515 and the memory device receiving first access command 520. Thus, tRCD 530 may be or include the time for the internal operations governed by first activation phases 550 to open the row inside first subarray 505.

Time tRTP 535 (e.g., Read-to-Precharge delay) may be the time elapsed (e.g., a number of clock cycles, which may be the minimum number of clock cycles) between the memory device receiving first access command 520 and the memory device receiving precharge command 525-a. Thus, tRTP 535 may be or include the time for the internal operations governed by phases triggered by the first access command 520 access the open row inside first subarray 505.

Time tRAS 540 (e.g., Row-Active time) may be the time elapsed (e.g., a number of clock cycles, which may be the minimum number of clock cycles) between the memory device receiving first activation command 515 and the memory device receiving precharge command 525-a. Thus, tRAS 540 may be or include the sum of time tRCD 530 and time tRTP 535.

Time tRP 570 (e.g., Row-Precharge time) may be the time elapsed (e.g., a number of clock cycles, which may be the minimum number of clock cycles) between the memory device receiving precharge command 525-a and completion of the precharge operation of the open row inside first subarray 505. Thus, tRP 570 may be or include the time for the internal operations governed by precharge phases 555 to close the row inside first subarray 505.

Time tRC 560 (e.g., Row-Cycle time) may be the time elapsed between the memory device receiving first activation command 515 and completion of the precharge operation of the open row inside first subarray 505. Thus, tRC 560 may be or include the total time to perform an access operation on a row (e.g., may be or include the sum of time tRAS 540 and tRP 570).

For some memory devices, a memory controller 315 may have to wait for a duration of at least tRP 570 before issuing to the memory device a subsequent activation command for another row within the same bank as the row associated with precharge command 525-a, regardless of whether the row associated with precharge command 525-a and the row to be subsequently opened are in the same subarray or in different subarrays of the bank. For example, some memory devices may generate and maintain phases only at the bank level (e.g., using bank-specific structures or processes that operate at the bank level of granularity, rather than subarray-specific structures or processes that operate at the subarray level of granularity). In such examples, if the memory device receives second activation command 595 (for a second row in the same bank) prior to the end of tRP 570 (which may also be the end of tRC 560), the phases 545 associated with the first subarray 505—such as precharge phases 555—may be overwritten, replaced, or otherwise destroyed or lost, and thus one or more aspects of the access operation for the first row (e.g., the precharge operation triggered by precharge command 525-a) may not properly execute or be completed. Additionally or alternatively, if the memory device receives second activation command 595 (for a second row in the same bank) prior to the end of tRP 570, activation (e.g., opening) of the second row in the same bank may not properly execute or be completed, or some other error condition may arise.

In some examples as described herein, however, the memory device that includes the first subarray 505 and the second subarray 580 (both of which may be within the same bank of the memory device) may maintain phases (such as phases 545 or phases 590) using subarray-specific structures or processes that operate at the subarray level of granularity (e.g., subarray-specific latching circuits 345, as described in reference to FIG. 3). For example, the memory device may maintain phases 545 using structures or processes that are specific to (e.g., dedicated to, included in) first subarray 505. Thus, even if the second activation command 595 is received before the end of tRP 570 (e.g., before the first row in the first subarray 505 is closed), the precharge phases 555 or other phases 545 may continue (persist, be maintained) until the precharge operation or other aspects of the access operation for the first row have been executed and completed. That is, phases 545 may be maintained until completion of the associated operations independent of any phases or associated commands for other subarrays, even if within the same bank as the first subarray 505.

In some cases, phases 545 may be generated globally (e.g., within the memory device, but outside of the first subarray 505, such as by a device memory controller 155, a local memory controller 165, a phase generator 350, or some other logic or other circuitry shared by (configured to generate phases for) multiple subarrays within a same bank), but may be duplicated and maintained by a component specific to first subarray 505. In other cases, phases 545 may be generated and also maintained locally (e.g., within the first subarray 505).

Accordingly, for a memory device as described herein, a memory controller 315 may be able to wait for a duration (e.g., a number of clock cycles, which may be the minimum number of clock cycles) corresponding to tRP_S (e.g., Shortened Row Precharge Time) between sending the precharge command 525-a and sending the second activation command 595. Thus, tRP_S 575 may be the time (e.g., a number of clock cycles, which may be the minimum number of clock cycles) between the memory device receiving the precharge command 525-a and the memory device receiving the second activation command 595. As shown by FIG. 5, tRP_S 575 may be shorter than tRP 570. Thus, for example, tRP 570 may in some cases be a minimum time (e.g., minimum number of clock cycles) that a memory controller 315 must wait between sending a precharge command and an immediately successive activation command for rows in a same subarray, whereas tRP_S 575 may be a minimum time (e.g., minimum number of clock cycles) that the memory controller 315 must wait between sending a precharge command and an immediately successive activation command for rows in different subarrays of a same bank.

Additionally or alternatively, for a memory device as described herein, a memory controller 315 may be able to wait for a duration (e.g., a number of clock cycles, which may be the minimum number of clock cycles) corresponding to tRC_S (e.g., Shortened Row cycle time) between sending first activation command 515 and sending the second activation command 595. Thus, tRC_S 565 may be the time (e.g., a number of clock cycles, which may be the minimum number of clock cycles) between the memory device receiving first activation command 515 and the memory device receiving the second activation command 595. As shown by FIG. 5, tRC_S 565 may be shorter than tRC 560. Thus, for example, tRC 560 may in some cases be a minimum time (e.g., minimum number of clock cycles) that a memory controller 315 must wait between sending successive activation commands for rows in a same subarray, whereas tRC_S 565 may be a minimum time (e.g., minimum number of clock cycles) that the memory controller 315 must wait between sending successive activation commands for rows in different subarrays of a same bank.

As described with reference to phases 545 for the first subarray 505, phases 590 (including second activation phases 599) for the second subarray 580 may be maintained using structures or processes (e.g., a latching circuit 345) specific to the second subarray 580. Similarly, phases 590 may be generated globally and duplicated or otherwise maintained locally, or may in some cases be generated locally.

In some cases, for a memory device that supports a tRP_S as described herein, a memory controller 315 may determine a time for issuing the second activation command 595 based on whether the row associated with the precharge command 525-a and the row associated with the second activation command 595 are in a same or different subarray within the same bank. For example, the memory controller 315 may determine a delay between issuing the precharge command 525-a and issuing the second activation command 595 based on whether the row associated with the precharge command 525-a and the row associated with the second activation command 595 are in a same or different subarray. This may include selecting between tRP 570 and tRP_S 575, for example. In the example illustrated in FIG. 5, the row associated with the precharge command 525-a is in the first subarray 505, and the row associated with the second activation command 595 is in the second subarray 580, and thus the memory controller 315 may select tRP_S 575. In other examples, the row associated with a precharge command and the row associated a subsequent activation command may be in a same subarray, and the memory controller 315 may select tRP 570, which may in some cases be referred to as a default tRP.

Figure 6:
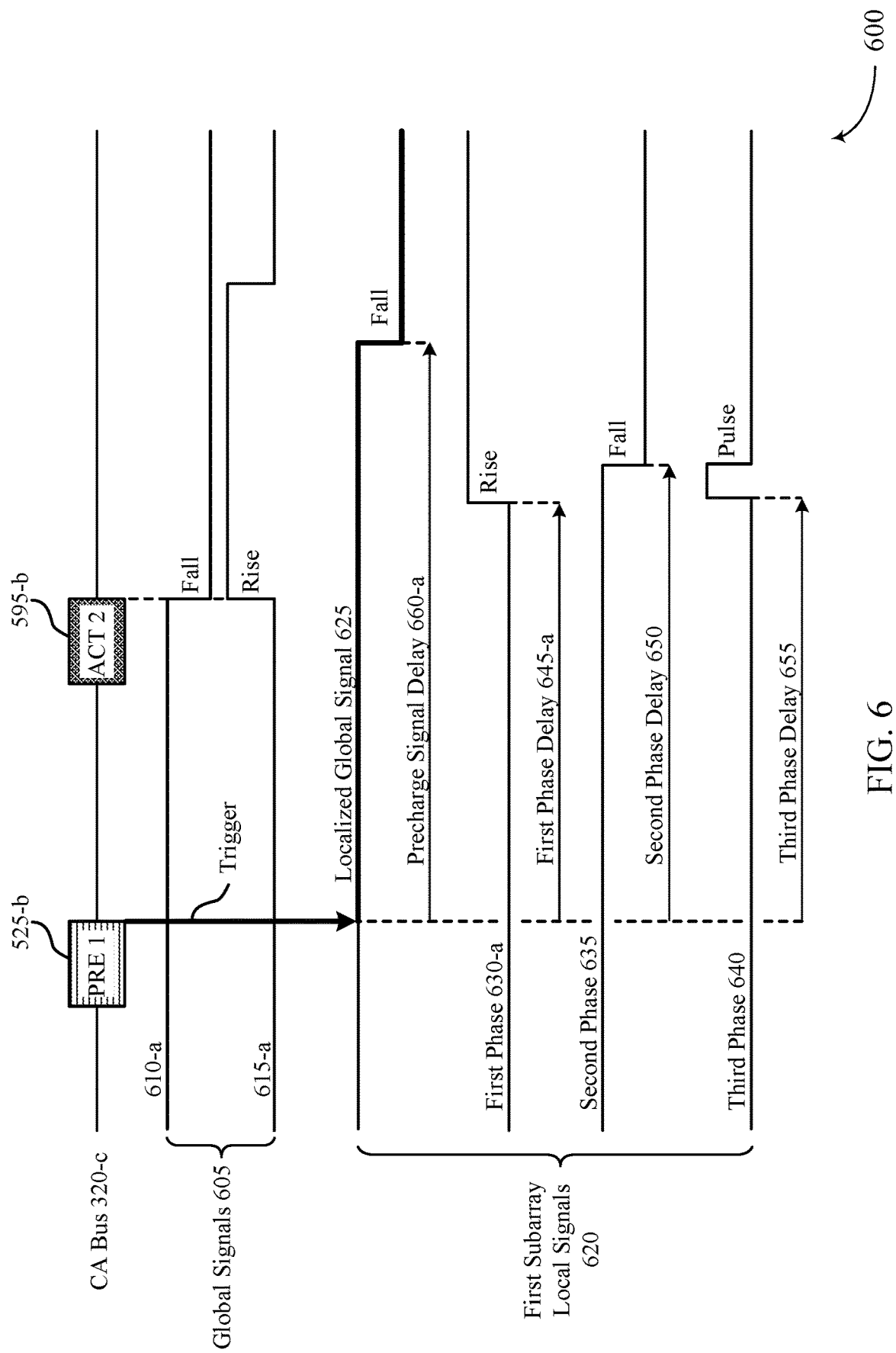

FIG. 6 illustrates an example of a command timeline 600 that supports parallel access for memory subarrays in accordance with examples as disclosed herein. FIG. 6 illustrates example command signaling as well as example local and global signaling, including phases and associated delays (e.g., triggers for internal operations relative to an associated command), during access operations for two rows in two different subarrays within the same bank of a memory device.

A memory device may receive commands from a memory controller. Examples of commands, as discussed in relation to FIGS. 4 and 5, may be access operation commands, which may include activation commands, access commands, and precharge commands. The commands may be communicated to the memory device over a CA bus 320-c.

The commands may trigger (e.g., cause) the memory device to generate global signals 605, which may indicate which subarray of a set of subarrays within a bank is activated (e.g., to which any currently ongoing global phases correspond). Thus, for example, when the memory device receives precharge command 525-b, the memory device may have previously generated global signal 610-a based on a prior activation command for the subarray to which precharge command 525-b is directed. When global signal 610-a is in a high state, this may indicate or otherwise correspond to a first subarray (to which the precharge command 525-b is directed) being activated. The precharge command 525-b may be representative of the precharge command 525-a described with reference to FIG. 5, and thus the first subarray may be the first subarray 505.

As another example, when the memory device receives the second activation command 595-b, the memory device may generate global signal 615-a. When global signal 615-a is in a high state, this may indicate or otherwise correspond to the subarray (to which second activation command 595-b is directed) being activated. The second activation command 595-b may be representative of the second activation command 595 described with reference to FIG. 5, and thus the second subarray may be the second subarray 580.

In some cases, the memory device may maintain global signals 605 (e.g., global phases) on a bank-by-bank basis (e.g., with a bank level of granularity). Accordingly, when global signal 615-a is triggered (e.g., goes high), the global signal 610-a may be destroyed or otherwise discontinued prematurely (e.g., go low). For example, the precharge command 525-b may be associated with a corresponding set of precharge phases (e.g., precharge phases 555), whose duration may correspond to precharge signal delay 660-a, which may correspond to tRP 570 as described with reference to FIG. 5. When the memory device receives the second activation command 595-b, global signal 610-a may go low before the end of precharge signal delay 660-a, if second activation command 595-b is received based on a tRP_S 575 as illustrated in the examples of FIGS. 5 and 6.

The memory device may, however, duplicate and maintain global signals 605—along with any associated phases—locally (e.g., using structures or processes that are subarray-specific, such as latching circuit 345) using any number of first subarray local signals 620. For example, upon or after generating global signal 610-a for the first subarray, the memory device may have also generated (e.g., through duplication, latching) localized global signal 625, which may be a copy (duplicate) of global signal 610-a as generated globally. The memory device may also have also generated (e.g., through duplication, latching) localized versions of any global phases (not shown) associated with global signal 610-a, which may be represented by the examples of first phase 630-a, second phase 635, and third phase 640. First phase 630-a may be an example of a phase for which a rising edge of the phase signal triggers a corresponding internal operation (e.g., a first internal operation included in a broader precharge operation) with a first phase delay 645-a relative to receipt of the precharge command 525-b. Second phase 635 may be an example of a phase for which a falling edge of the phase signal triggers a corresponding internal operation (e.g., a second internal operation included in the broader precharge operation) with a second phase delay 650 relative to receipt of the precharge command 525-b. Third phase 640 may be an example of a phase for which a pulse (e.g., a rising edge and a falling edge in combination) of the phase signal triggers a corresponding internal operation (e.g., a third internal operation included in the broader precharge operation) with a third phase delay 655 relative to receipt of the precharge command 525-b.

As illustrated in the example of FIG. 6, even after the second activation command 595-b is received by the memory device, the first subarray local signals 620 may be maintained (e.g., may continue evolving and otherwise persist through completion). For example, even if global signal 610-a falls prematurely (e.g., before the end of precharge signal delay 660-a, before a tRP 570 duration) due to receipt of the second activation command 595 (e.g., at a time based on tRP_S 575), localized global signal 625 does not fall until the end of precharge signal delay 660-a, and the internal operations associated with corresponding phases (e.g., phases 630-a, 645-a, 640) may be triggered (e.g., by one or more changes in the associated phase signal) at appropriate times (e.g., with appropriate delays relative to the precharge command 525-b), even after the second activation command 595-b has been received.

Figure 7:
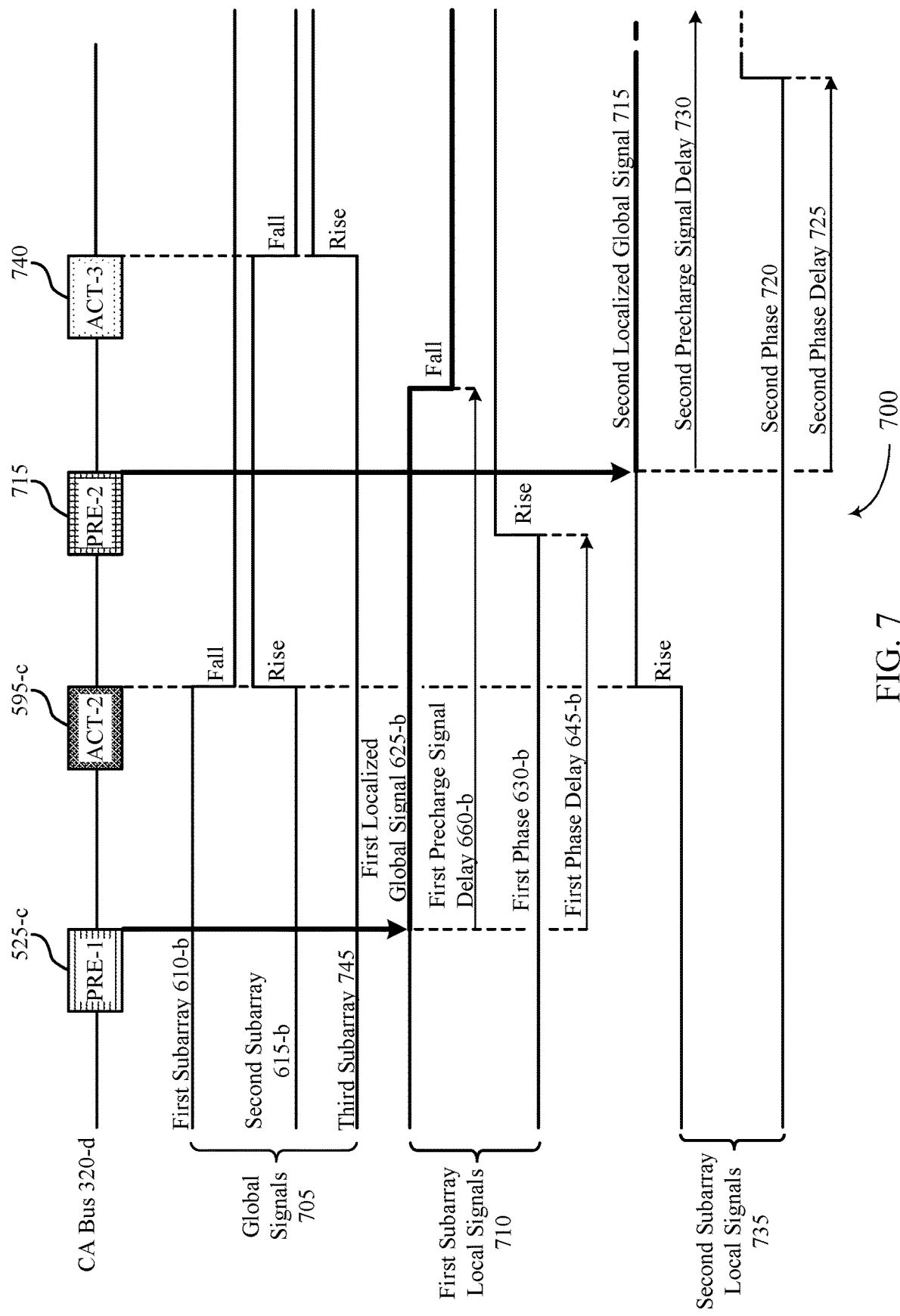

FIG. 7 illustrates an example of a command timeline 700 that supports parallel access for memory subarrays in accordance with examples as disclosed herein. FIG. 7 illustrates example command signaling as well as example local and global signaling, including phases and associated delays (e.g., triggers for internal operations relative to an associated command), during access operations for three rows in three different subarrays within the same bank of a memory device.

CA bus 320-d, precharge command 525-c, second activation command 595-c, first subarray global signal 610-b, second subarray global signal 615-b, and first subarray local signals 710 may be similar or identical to CA bus 320-c, precharge command 525-b, second activation command 595-b, global signal 610-a, global signal 615-a, and first subarray local signals 620 as described with reference to FIG. 6.

FIG. 7 may illustrate an example in which, subsequent to the second activation command 595-c, a second precharge command 715 is received by the memory device prior to the end of first precharge signal delay 660-b (e.g., prior to the tRP 570 time that would be associated with the precharge command 525-c).

As shown in FIG. 7, when the second activation command 595-c is received by the memory device, second subarray global signal 615-b may be triggered (e.g., go high), and the global signal 610-a may be destroyed or otherwise discontinued prematurely (e.g., go low). However, first subarray local signals 710 may persist (e.g., be maintained locally within or for the first subarray). Similarly, when the second precharge command 715 is received, first subarray local signals 710 may persist (e.g., be maintained locally within or for the first subarray). Thus, first subarray local signals 710 may persist for the entirety of the first precharge signal delay 660-b, even if both a second activation command 595-c and a second precharge command 715 for a second subarray in the same bank are received before completion of the associated precharge operation (e.g., before the row in the first subarray is closed).

Further, upon or after generating second subarray global signal 615-b, the memory device may also generate (e.g., through duplication, latching) second localized global signal 717, which may be a copy (duplicate) of second subarray global signal 615-b as generated globally. The memory device may also have also generated (e.g., through duplication, latching) localized versions of any global phases (not shown) associated with second subarray global signal 615-b, which may be represented by the example of second phase 720, which may be one of any number of phases included in second subarray local signals 735. Second phase 720 may be an example of a phase for which a rising edge of the phase signal triggers a corresponding internal operation (e.g., an internal operation included in a broader precharge operation) with a second phase delay 725 relative to receipt of the second precharge command 715.

As illustrated in the example of FIG. 7, even after the third activation command 740 is received by the memory device, the second subarray local signals 735 may be maintained (e.g., may continue evolving and otherwise persist through completion). For example, even if second subarray global signal 615-b falls prematurely (e.g., before the end of second precharge signal delay 730, before a tRP 570 duration relative to the second precharge command 715) due to receipt of the third activation command 740 (e.g., at a time based on tRP_S 575), second localized global signal 717 does not fall until the end of second precharge signal delay 730, and the internal operations associated with corresponding phases (e.g., second phase 720) may be triggered (e.g., by one or more changes in the associated phase signal) at appropriate times (e.g., with appropriate delays relative to the second precharge command 715), even after the third activation command 740 has been received.

Thus, generally, by duplicating or otherwise maintaining phases associated with subarray-specific operations on a per-subarray basis (e.g., locally within the respective subarray), any number of commands may be received and corresponding phases triggered for other subarrays—even other subarrays within a same bank—without adversely impacting ongoing operations (e.g., phases and associated internal operations) for a previously activated subarray in the bank.

Figure 8:
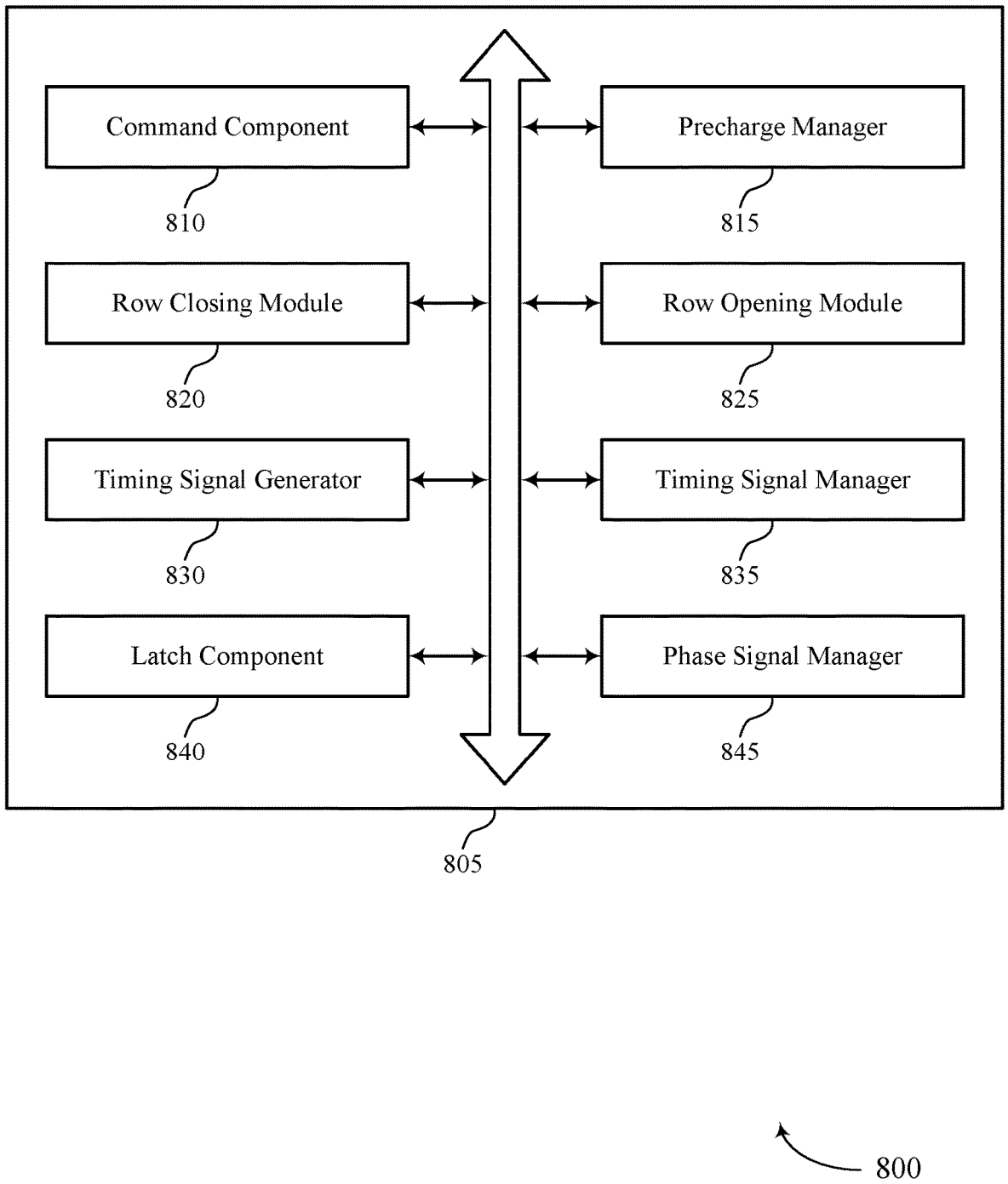
FIG. 8 shows a block diagram of a memory device that supports parallel access for memory subarrays in accordance with aspects of the present disclosure.

FIG. 8 shows a block diagram 800 of a memory device 805 that supports parallel access for memory subarrays in accordance with examples as disclosed herein. The memory device 805 may be an example of aspects of a memory device as described with reference to FIGS. 3 through 7. The memory device 805 may include a command component 810, a precharge manager 815, a row closing module 820, a row opening module 825, a timing signal generator 830, a timing signal manager 835, a latch component 840, and a phase signal manager 845. Each of these modules may communicate, directly or indirectly, with one another (e.g., via one or more buses).

The command component 810 may receive, at a memory device, a first activation command to open a first row of memory cells in a first subarray of a bank. In some examples, the command component 810 may receive, at the memory device before the first row of memory cells in the first subarray of the bank is closed, a second activation command to open a second row of memory cells in a second subarray of the bank. In some cases, the command component 810 may receive, at the memory device, a third activation command to open a third row of memory cells in a third subarray of the bank. In some aspects, the command component 810 may receive, at the memory device, a fourth activation command to open a fourth row of memory cells in the third subarray of the bank, where the fourth activation command is received a second amount of time after the third precharge command is received, the second amount of time longer than the first amount of time. In some instances, the first amount of time includes a tRP_S and the second amount of time includes a default tRP.

The precharge manager 815 may receive, at the memory device after receiving the first activation command, a precharge command to close the first row of memory cells. In some examples, the precharge manager 815 may receive, at the memory device after receiving the second activation command, a second precharge command to close the second row of memory cells. In some aspects, the precharge manager 815 may receive, at the memory device, a third precharge command to close the third row of memory cells.

The row closing module 820 may close the first row of memory cells, based on receiving the precharge command, after receiving the second activation command. In some examples, the row closing module 820 may close the first row of memory cells after receiving the second activation command based on maintaining the set of timing signals. In some aspects, the row closing module 820 may close the first row of memory cells after a second delay following reception of the precharge command, the second delay based on the second set of phase signals.

The row opening module 825 may open the first row of memory cells based on the first activation command, where the second activation command is received while the first row of memory cells is open. In some examples, the row opening module 825 may open the first row of memory cells after a first delay following reception of the first activation command, the first delay based on the first set of phase signals. In some aspects, the row opening module 825 may open the second row of memory cells after a third delay following reception of the second activation command, the third delay based on the third set of phase signals.

The timing signal generator 830 may generate, based on receiving the precharge command, a set of timing signals to close the first row of memory cells.

The timing signal manager 835 may maintain the set of timing signals after receiving the second activation command. In some examples, the timing signal manager 835 may maintain the set of timing signals after receiving the second precharge command.

The latch component 840 may latch the set of timing signals within the first subarray after receiving the precharge command.

The phase signal manager 845 may trigger a first set of phase signals at the memory device based on receiving the first activation command, the first set of phase signals to open the first row of memory cells. In some examples, the phase signal manager 845 may trigger a second set of phase signals at the memory device based on receiving the precharge command, the second set of phase signals to close the first row of memory cells. In some instances, the phase signal manager 845 may trigger a third set of phase signals at the memory device based on receiving the second activation command, the third set of phase signals to open the second row of memory cells.

Figure 9:
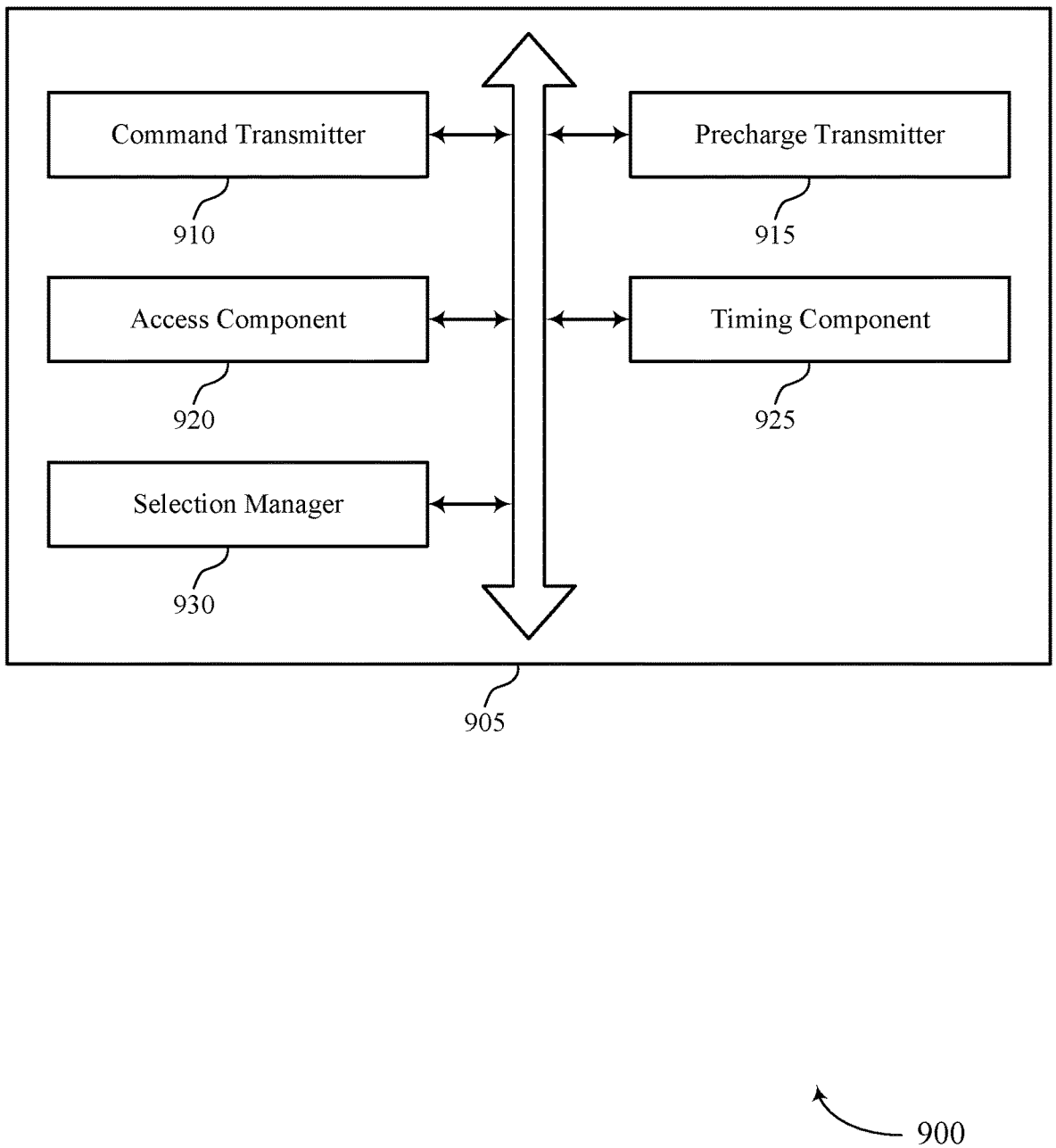
FIG. 9 shows a block diagram of a host device that supports parallel access for memory subarrays in accordance with aspects of the present disclosure.

FIG. 9 shows a block diagram 900 of a host device 905 that supports parallel access for memory subarrays in accordance with examples as disclosed herein. The host device 905 may be an example of aspects of a host device as described with reference to FIGS. 3 through 7. The host device 905 may include a command transmitter 910, a precharge transmitter 915, an access component 920, a timing component 925, and a selection manager 930. Each of these modules may communicate, directly or indirectly, with one another (e.g., via one or more buses).

The command transmitter 910 may transmit, to a memory device, a first activation command to open a first row of memory cells in a first subarray of a bank of the memory device. In some examples, the command transmitter 910 may transmit, to the memory device, the second activation command at the determined time.

The precharge transmitter 915 may transmit, to the memory device after transmitting the first activation command for the first row, a first precharge command to close the first row of memory cells.

The access component 920 may determine to access a second row of memory cells in a second subarray of the bank.

The timing component 925 may determine, based on the second row being in the second subarray and the first row being in the first subarray, a time to transmit a second activation command to open the second row. In some examples, the timing component 925 may determine the time to transmit the second activation command based on a first time delay associated with consecutive accesses to rows within a same subarray and a second time delay for consecutive accesses to rows within different subarrays of the bank, the first time delay longer than the second time delay. In some cases, the determined time corresponds to a default precharge time when the first and second subarrays are the same. In some instances, the determined time corresponds to a tRP_S when the first and second subarrays are different.

The selection manager 930 may select a row tRP for the second activation command, where the selecting is between a first tRP for consecutive accesses to rows within a same subarray and a second tRP for consecutive accesses to rows within different subarrays of the bank, the second tRP shorter than the first tRP.

Figure 10:
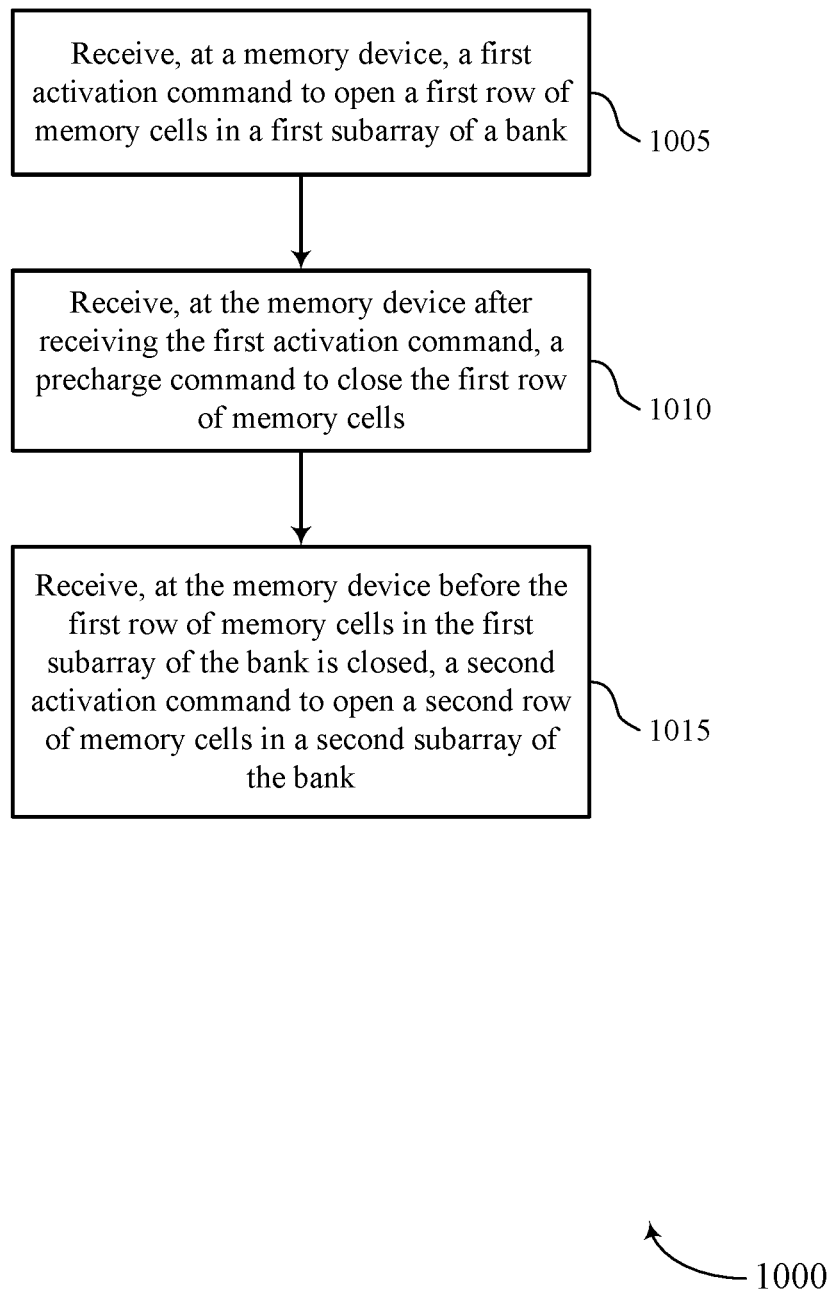
FIGS. 10 through 13 show flowcharts illustrating a method or methods that support parallel access for memory subarrays in accordance with examples as disclosed herein.

FIG. 10 shows a flowchart illustrating a method or methods 1000 that supports parallel access for memory subarrays in accordance with aspects of the present disclosure. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may receive a first activation command to open a first row of memory cells in a first subarray of a bank. The operations of 1005 may be performed according to the methods described herein. In some examples, aspects of the operations of 1005 may be performed by a command component as described with reference to FIG. 8.

At 1010, the memory device may receive, after receiving the first activation command, a precharge command to close the first row of memory cells. The operations of 1010 may be performed according to the methods described herein. In some examples, aspects of the operations of 1010 may be performed by a precharge manager as described with reference to FIG. 8.

At 1015, the memory device may receive, before the first row of memory cells in the first subarray of the bank is closed, a second activation command to open a second row of memory cells in a second subarray of the bank. The operations of 1015 may be performed according to the methods described herein. In some examples, aspects of the operations of 1015 may be performed by a command component as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for receiving, at a memory device, a first activation command to open a first row of memory cells in a first subarray of a bank, receiving, at the memory device after receiving the first activation command, a precharge command to close the first row of memory cells, and receiving, at the memory device before the first row of memory cells in the first subarray of the bank is closed, a second activation command to open a second row of memory cells in a second subarray of the bank.

Some examples of the method 1000 and the apparatus described herein may further include operations, features, means, or instructions for closing the first row of memory cells, based on receiving the precharge command, after receiving the second activation command.

Some examples of the method 1000 and the apparatus described herein may further include operations, features, means, or instructions for opening the first row of memory cells based on the first activation command, where the second activation command may be received while the first row of memory cells may be open.

Some examples of the method 1000 and the apparatus described herein may further include operations, features, means, or instructions for generating, based on receiving the precharge command, a set of timing signals to close the first row of memory cells, maintaining the set of timing signals after receiving the second activation command, and closing the first row of memory cells after receiving the second activation command based on maintaining the set of timing signals.

In some examples of the method 1000 and the apparatus described herein, maintaining the set of timing signals may include operations, features, means, or instructions for latching the set of timing signals within the first subarray after receiving the precharge command.

Some examples of the method 1000 and the apparatus described herein may further include operations, features, means, or instructions for receiving, at the memory device after receiving the second activation command, a second precharge command to close the second row of memory cells, and maintaining the set of timing signals after receiving the second precharge command.

Some examples of the method 1000 and the apparatus described herein may further include operations, features, means, or instructions for receiving, at the memory device, a third activation command to open a third row of memory cells in a third subarray of the bank, receiving, at the memory device, a third precharge command to close the third row of memory cells, and receiving, at the memory device, a fourth activation command to open a fourth row of memory cells in the third subarray of the bank, where the fourth activation command may be received a second amount of time after the third precharge command may be received, the second amount of time longer than the first amount of time.

In some examples of the method 1000 and the apparatus described herein, the first amount of time includes a tRP_S and the second amount of time includes a default tRP.

Some examples of the method 1000 and the apparatus described herein may further include operations, features, means, or instructions for triggering a first set of phase signals at the memory device based on receiving the first activation command, the first set of phase signals to open the first row of memory cells, triggering a second set of phase signals at the memory device based on receiving the precharge command, the second set of phase signals to close the first row of memory cells, and triggering a third set of phase signals at the memory device based on receiving the second activation command, the third set of phase signals to open the second row of memory cells.

Some examples of the method 1000 and the apparatus described herein may further include operations, features, means, or instructions for opening the first row of memory cells after a first delay following reception of the first activation command, the first delay based on the first set of phase signals, closing the first row of memory cells after a second delay following reception of the precharge command, the second delay based on the second set of phase signals, and opening the second row of memory cells after a third delay following reception of the second activation command, the third delay based on the third set of phase signals.

Figure 11:
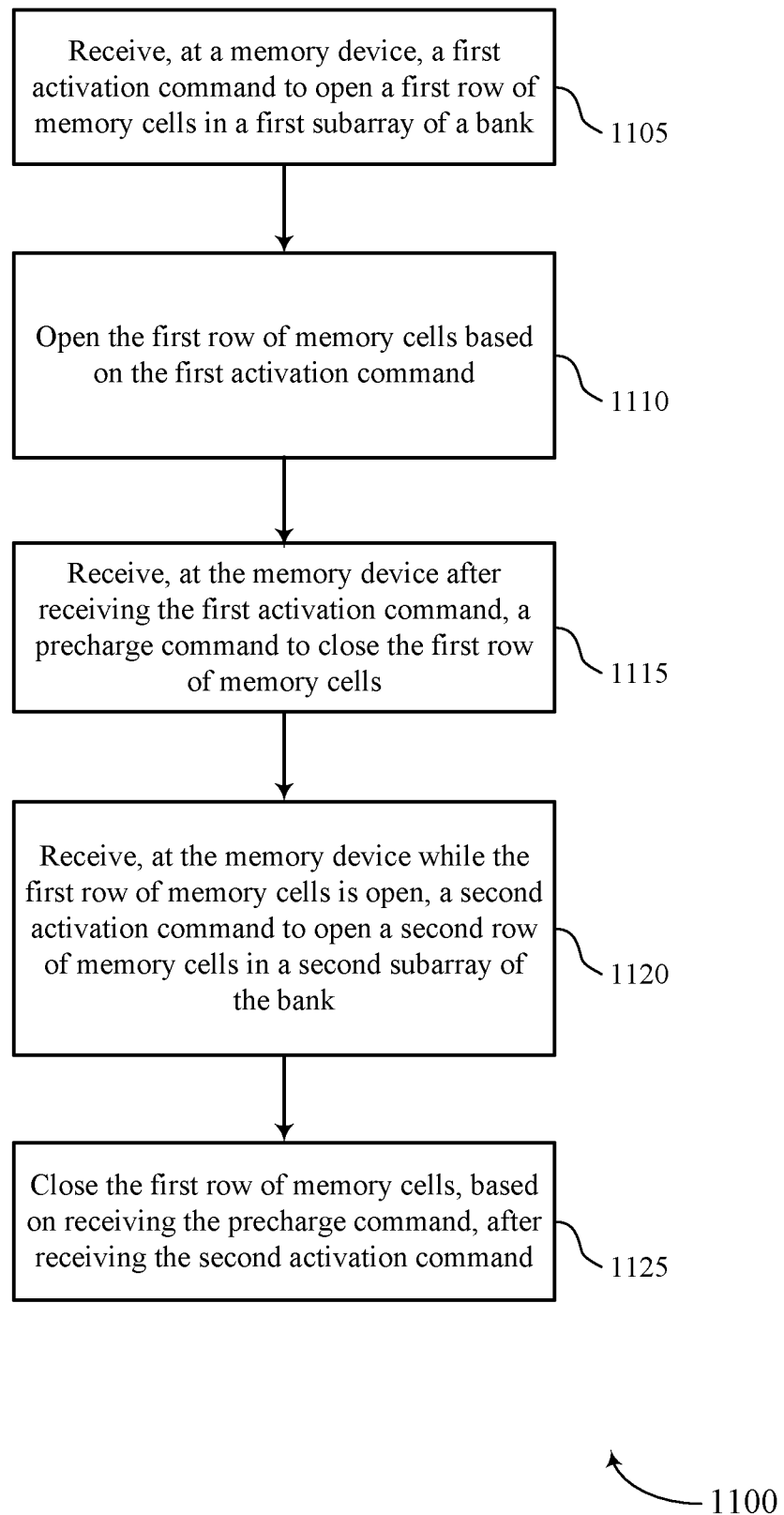

FIG. 11 shows a flowchart illustrating a method or methods 1100 that supports parallel access for memory subarrays in accordance with aspects of the present disclosure. The operations of method 1100 may be implemented by a memory device or its components as described herein. For example, the operations of method 1100 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1105, the memory device may receive, at a memory device, a first activation command to open a first row of memory cells in a first subarray of a bank. The operations of 1105 may be performed according to the methods described herein. In some examples, aspects of the operations of 1105 may be performed by a command component as described with reference to FIG. 8.

At 1110, the memory device may open the first row of memory cells based on the first activation command. The operations of 1110 may be performed according to the methods described herein. In some examples, aspects of the operations of 1110 may be performed by a row opening module as described with reference to FIG. 8.

At 1115, the memory device may receive, at the memory device after receiving the first activation command, a precharge command to close the first row of memory cells. The operations of 1115 may be performed according to the methods described herein. In some examples, aspects of the operations of 1115 may be performed by a precharge manager as described with reference to FIG. 8.

At 1120, the memory device may receive, at the memory device while the first row of memory cells is open, a second activation command to open a second row of memory cells in a second subarray of the bank. The operations of 1120 may be performed according to the methods described herein. In some examples, aspects of the operations of 1120 may be performed by a command component as described with reference to FIG. 8.

At 1125, the memory device may close the first row of memory cells, based on receiving the precharge command, after receiving the second activation command. The operations of 1125 may be performed according to the methods described herein. In some examples, aspects of the operations of 1125 may be performed by a row closing module as described with reference to FIG. 8.

Figure 12:
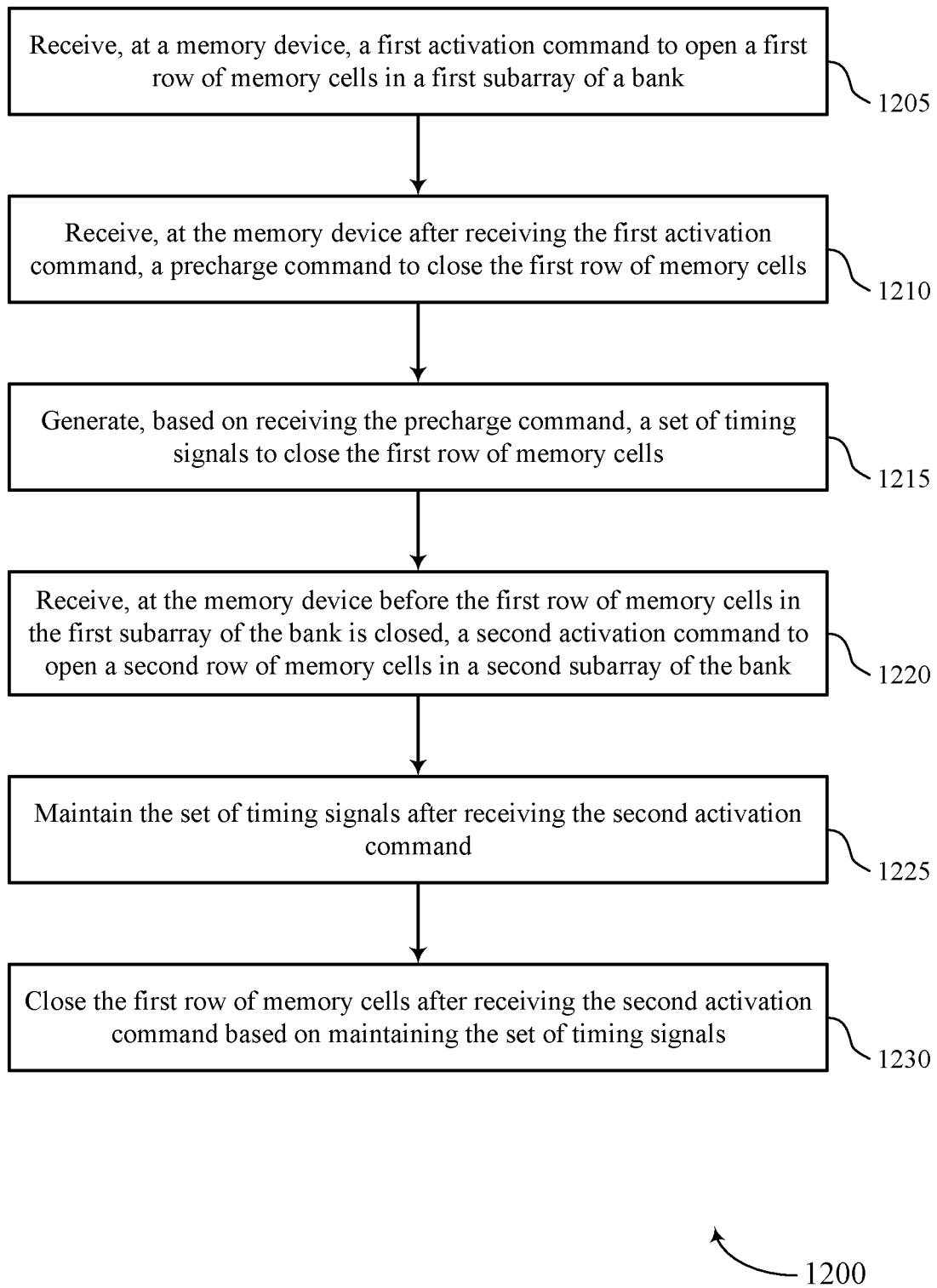

FIG. 12 shows a flowchart illustrating a method or methods 1200 that supports parallel access for memory subarrays in accordance with aspects of the present disclosure. The operations of method 1200 may be implemented by a memory device or its components as described herein. For example, the operations of method 1200 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1205, the memory device may receive, at a memory device, a first activation command to open a first row of memory cells in a first subarray of a bank. The operations of 1205 may be performed according to the methods described herein. In some examples, aspects of the operations of 1205 may be performed by a command component as described with reference to FIG. 8.

At 1210, the memory device may receive, at the memory device after receiving the first activation command, a precharge command to close the first row of memory cells. The operations of 1210 may be performed according to the methods described herein. In some examples, aspects of the operations of 1210 may be performed by a precharge manager as described with reference to FIG. 8.

At 1215, the memory device may generate, based on receiving the precharge command, a set of timing signals to close the first row of memory cells. The operations of 1215 may be performed according to the methods described herein. In some examples, aspects of the operations of 1215 may be performed by a timing signal generator as described with reference to FIG. 8.

At 1220, the memory device may receive, at the memory device before the first row of memory cells in the first subarray of the bank is closed, a second activation command to open a second row of memory cells in a second subarray of the bank. The operations of 1220 may be performed according to the methods described herein. In some examples, aspects of the operations of 1220 may be performed by a command component as described with reference to FIG. 8.

At 1225, the memory device may maintain the set of timing signals after receiving the second activation command. The operations of 1225 may be performed according to the methods described herein. In some examples, aspects of the operations of 1225 may be performed by a timing signal manager as described with reference to FIG. 8.

At 1230, the memory device may close the first row of memory cells after receiving the second activation command based on maintaining the set of timing signals. The operations of 1230 may be performed according to the methods described herein. In some examples, aspects of the operations of 1230 may be performed by a row closing module as described with reference to FIG. 8.

Figure 13:
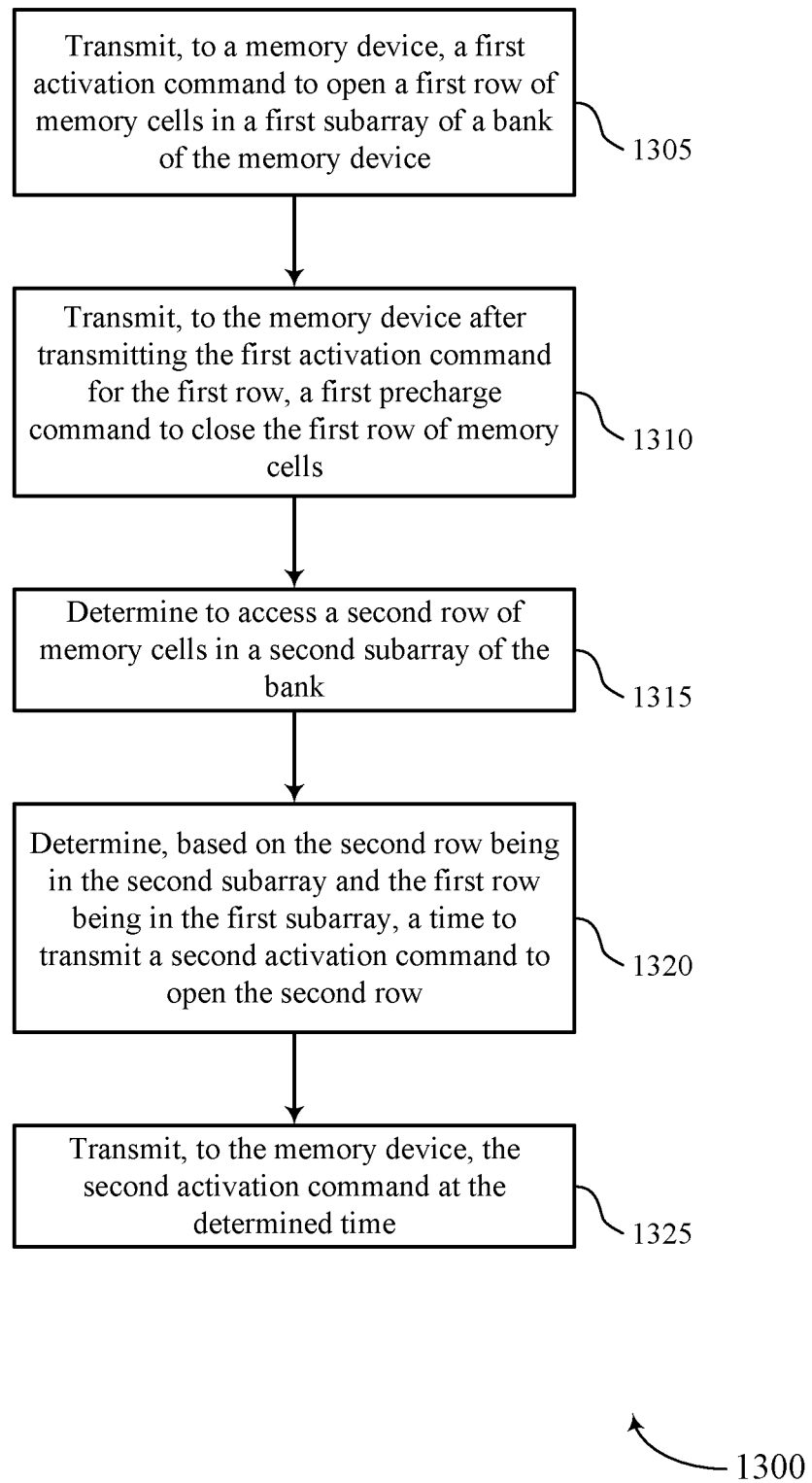

FIG. 13 shows a flowchart illustrating a method or methods 1300 that supports parallel access for memory subarrays in accordance with aspects of the present disclosure. The operations of method 1300 may be implemented by a host device or its components as described herein. For example, the operations of method 1300 may be performed by a host device as described with reference to FIG. 9. In some examples, a host device may execute a set of instructions to control the functional elements of the host device to perform the described functions. Additionally or alternatively, a host device may perform aspects of the described functions using special-purpose hardware.

At 1305, the host device may transmit, to a memory device, a first activation command to open a first row of memory cells in a first subarray of a bank of the memory device. The operations of 1305 may be performed according to the methods described herein. In some examples, aspects of the operations of 1305 may be performed by a command transmitter as described with reference to FIG. 9.

At 1310, the host device may transmit, to the memory device after transmitting the first activation command for the first row, a first precharge command to close the first row of memory cells. The operations of 1310 may be performed according to the methods described herein. In some examples, aspects of the operations of 1310 may be performed by a precharge transmitter as described with reference to FIG. 9.

At 1315, the host device may determine to access a second row of memory cells in a second subarray of the bank. The operations of 1315 may be performed according to the methods described herein. In some examples, aspects of the operations of 1315 may be performed by an access component as described with reference to FIG. 9.

At 1320, the host device may determine, based on the second row being in the second subarray and the first row being in the first subarray, a time to transmit a second activation command to open the second row. The operations of 1320 may be performed according to the methods described herein. In some examples, aspects of the operations of 1320 may be performed by a timing component as described with reference to FIG. 9.

At 1325, the host device may transmit, to the memory device, the second activation command at the determined time. The operations of 1325 may be performed according to the methods described herein. In some examples, aspects of the operations of 1325 may be performed by a command transmitter as described with reference to FIG. 9.

In some examples, an apparatus as described herein may perform a method or methods, such as the method 1300. The apparatus may include features, means, or instructions (e.g., a non-transitory computer-readable medium storing instructions executable by a processor) for transmitting, to a memory device, a first activation command to open a first row of memory cells in a first subarray of a bank of the memory device, transmitting, to the memory device after transmitting the first activation command for the first row, a first precharge command to close the first row of memory cells, determining to access a second row of memory cells in a second subarray of the bank, determining, based on the second row being in the second subarray and the first row being in the first subarray, a time to transmit a second activation command to open the second row, and transmitting, to the memory device, the second activation command at the determined time.

In some examples of the method 1300 and the apparatus described herein, determining time to transmit the second activation command may include operations, features, means, or instructions for selecting a tRP for the second activation command, where the selecting may be between a first tRP for consecutive accesses to rows within a same subarray and a second tRP for consecutive accesses to rows within different subarrays of the bank, the second tRP shorter than the first tRP.

Some examples of the method 1300 and the apparatus described herein may further include operations, features, means, or instructions for determining the time to transmit the second activation command based on a first time delay associated with consecutive accesses to rows within a same subarray and a second time delay for consecutive accesses to rows within different subarrays of the bank, the first time delay longer than the second time delay.

In some examples of the method 1300 and the apparatus described herein, the determined time corresponds to a default precharge time (e.g., tRP) when the first and second subarrays may be the same, and the determined time corresponds to a shortened precharge time (e.g., tRP_S) when the first and second subarrays may be different.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a bank of a memory device, the bank including a first subarray and a second subarray, a command component of the memory device, the command component configured to receive commands for the first subarray and commands for the second subarray, where the commands for the first subarray trigger timing signals for the first subarray, and where the commands for the second subarray trigger timing signals for the second subarray, and a first latching circuit configured to maintain the timing signals for the first subarray independent of the commands for the second subarray.

In some examples, the memory device supports a first tRP for consecutive accesses to different rows of memory cells within a same subarray and a second tRP for consecutive accesses to rows of memory cells within different subarrays of the bank.

In some examples, the second tRP may be shorter than the first tRP.

Some examples of the apparatus may include a timing component for the memory device and configured to generate the timing signals for the first subarray and the timing signals for the second subarray.

In some examples, the first subarray includes the first latching circuit.

Some examples of the apparatus may include a second latching circuit configured to maintain the timing signals for the second subarray independent of the commands for the first subarray.

In some examples, the second subarray includes the second latching circuit.

Some examples of the apparatus may include a set of latching circuits including the first latching circuit and a second latching circuit for the second subarray, where each of the set of latching circuits may be configured to maintain timing signals for a respective subarray independent of commands for other subarrays.

Some examples of the apparatus may include a set of banks that includes the bank, where each of the set of banks may be coupled with the command component and includes multiple subarrays, the command component configured to receive commands for each of the set of banks.

In some examples, the memory device includes the set of banks, and where each of the multiple subarrays includes a respective latching circuit.

In some examples, the commands include activation commands, access commands (e.g., read commands, write commands), precharge commands, or any combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

Further, while certain aspects may be described herein using DRAM structures and terminology, this is by way of illustrative example only, and the teachings herein may be applied to any type of memory device, including but not limited to FeRAM memory devices.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a bank of a memory device, the bank comprising a set of subarrays, the set of subarrays comprising a first subarray and a second subarray;
   a command component of the memory device, the command component configured to receive commands for the first subarray and commands for the second subarray, wherein the commands for the first subarray trigger first timing signals for the first subarray, and wherein the commands for the second subarray trigger second timing signals for the second subarray; and
   a first latching circuit of a set of latching circuits configured to maintain the first timing signals for the first subarray independent of the commands for the second subarray, the first timing signals indicative of a phase of an access operation associated with the commands for the first subarray, wherein each subarray of the set of subarrays is coupled with a respective latching circuit of the set of latching circuits.

2. The apparatus of claim 1, wherein the memory device supports a first row precharge time (tRP) for consecutive accesses to different rows of memory cells within a same subarray and a second tRP for consecutive accesses to rows of memory cells within different subarrays of the bank.

3. The apparatus of claim 2, wherein the second tRP is shorter than the first tRP.

4. The apparatus of claim 1, further comprising:
   a timing component for the memory device and configured to generate the first timing signals for the first subarray and the second timing signals for the second subarray.

5. The apparatus of claim 1, wherein the first subarray comprises the first latching circuit.

6. The apparatus of claim 1, further comprising:
   a second latching circuit configured to maintain the second timing signals for the second subarray independent of the commands for the first subarray.

7. The apparatus of claim 6, wherein the second subarray comprises the second latching circuit.

8. The apparatus of claim 1, further comprising:
   a set of latching circuits including the first latching circuit and a second latching circuit for the second subarray, wherein each of the set of latching circuits is configured to maintain timing signals for a respective subarray independent of commands for other subarrays.

9. The apparatus of claim 1, further comprising:
   a set of banks that includes the bank, wherein each of the set of banks is coupled with the command component and comprises multiple subarrays, the command component configured to receive commands for each of the set of banks.

10. The apparatus of claim 9, wherein:
    the memory device comprises the set of banks; and
    each of the multiple subarrays comprises a respective latching circuit.

11. The apparatus of claim 1, wherein the commands comprise activation commands, read commands, write commands, precharge commands, or any combination thereof.

12. A method, comprising:
    transmitting, to a memory device, a first activation command to open a first row of memory cells in a first subarray of a bank of the memory device;
    transmitting, to the memory device after transmitting the first activation command for the first row, a first precharge command to close the first row of memory cells;
    determining to access a second row of memory cells in a second subarray of the bank;
    determining, based at least in part on the second row being in the second subarray and the first row being in the first subarray, a time to transmit a second activation command to open the second row, wherein determining the time to transmit the second activation command is based at least in part on a first time delay associated with consecutive accesses to rows within a same subarray and a second time delay associated with consecutive accesses to rows within different subarrays of the bank, the first time delay longer than the second time delay; and
    transmitting, to the memory device, the second activation command at the determined time.

13. The method of claim 12, wherein determining time to transmit the second activation command comprises:
    selecting a row precharge time (tRP) for the second activation command, wherein the selecting is between a first tRP for consecutive accesses to rows within a same subarray and a second tRP for consecutive accesses to rows within different subarrays of the bank, the second tRP shorter than the first tRP.

14. The method of claim 12, wherein:
the determined time corresponds to a default precharge time when the first and second subarrays are the same; and
the determined time corresponds to a shortened precharge time when the first and second subarrays are different.

15. A memory device, comprising:
a bank comprising a first subarray and a second subarray;
a first latching circuit coupled with the first subarray;
a second latching circuit coupled with the second subarray; and
a controller coupled with the bank and configured to:
receive a first activation command to open a first row of memory cells in the first subarray of the bank;
receive, after receiving the first activation command for the first row, a first precharge command to close the first row of memory cells, wherein the first activation command, the first precharge command, or both trigger a first set of timing signals for the first subarray;
maintain the first set of timing signals in the first latching circuit, wherein the first set of timing signals indicate a phase of a first access operation associated with the first activation command, the first precharge command, or both;
receive a second activation command to open a second row of memory cells in the second subarray of the bank, wherein the second activation command triggers a second set of timing signals for the second subarray; and
maintain the second set of timing signals in the second latching circuit independent of the first set of timing signals, wherein the second set of timing signals indicate a phase of a second access operation associated with the second activation command.

16. The memory device of claim 15, wherein the controller is further configured to:
receive, after receiving the first activation command and before receiving the first precharge command, a first access command indicating the first access operation associated with one or more memory cells of the first row of memory cells.

17. The memory device of claim 16, wherein the controller is further configured to:
access the one or more memory cells of the first row of memory cells based at least in part on the first access command, wherein the first access command triggers a subset of timing signals of the first set of timing signals for the first subarray, the subset of timing signals used to access the one or more memory cells.

18. The memory device of claim 15, further comprising:
a timing component for the memory device, the timing component and configured to generate the first set of timing signals for the first subarray and the second set of timing signals for the second subarray.

19. The memory device of claim 15, further comprising:
a set of latching circuits including the first latching circuit and the second latching circuit, wherein each of the set of latching circuits is configured to maintain timing signals for a respective subarray independent of commands for other subarrays of the bank.

* * * * *